(12) United States Patent
Shin et al.

(10) Patent No.: US 12,068,435 B2
(45) Date of Patent: Aug. 20, 2024

(54) DISPLAY DEVICE AND METHOD OF FABRICATING THE SAME

(71) Applicant: Samsung Display Co., LTD., Yongin-si (KR)

(72) Inventors: Dong Hee Shin, Asan-si (KR); Sun Kwun Son, Suwon-si (KR); Na Hyeon Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 374 days.

(21) Appl. No.: 17/404,380

(22) Filed: Aug. 17, 2021

(65) Prior Publication Data

US 2022/0069165 A1 Mar. 3, 2022

(30) Foreign Application Priority Data

Aug. 25, 2020 (KR) ........................ 10-2020-0106812

(51) Int. Cl.
*H01L 33/38* (2010.01)
*H01L 25/075* (2006.01)
*H01L 27/15* (2006.01)
*H01L 33/00* (2010.01)

(52) U.S. Cl.
CPC ........ *H01L 33/382* (2013.01); *H01L 25/0753* (2013.01); *H01L 27/156* (2013.01); *H01L 33/005* (2013.01); *H01L 2933/0016* (2013.01)

(58) Field of Classification Search
CPC .. H01L 33/382; H01L 25/0753; H01L 27/156
See application file for complete search history.

(56) References Cited

U.S. PATENT DOCUMENTS

| 2020/0258938 | A1* | 8/2020 | Chai | H01L 33/62 |
| 2021/0384252 | A1* | 12/2021 | Lee | H01L 27/156 |
| 2022/0037562 | A1* | 2/2022 | Moon | H01L 25/0753 |
| 2022/0059739 | A1* | 2/2022 | Li | H01L 33/54 |
| 2022/0068901 | A1* | 3/2022 | Kong | H01L 25/167 |

(Continued)

FOREIGN PATENT DOCUMENTS

| KR | 10-2018-0117182 | * 10/2018 |
| KR | 10-2018-0166401 | * 12/2018 |

(Continued)

*Primary Examiner* — Eugene Lee
(74) *Attorney, Agent, or Firm* — KILE PARK REED & HOUTTEMAN PLLC

(57) ABSTRACT

A display device comprises a planarization layer disposed on a substrate, a first alignment electrode and a second alignment electrode that extend in a first direction and are spaced apart from each other on the planarization layer, a first insulating layer disposed on the first alignment electrode and the second alignment electrode and comprising a first opening exposing the planarization layer between the first alignment electrode and the second alignment electrode, a light-emitting element disposed on the planarization layer overlapping the first opening, a first contact electrode and a second contact electrode disposed on the first insulating layer, the first contact electrode electrically contacting a first end of the light-emitting element and the second contact electrode electrically contacting a second end of the light-emitting element, and a second insulating layer disposed on the light-emitting element.

11 Claims, 25 Drawing Sheets

(56) References Cited

U.S. PATENT DOCUMENTS

| | | | |
|---|---|---|---|
| 2022/0102604 A1* | 3/2022 | Do | H01L 24/95 |
| 2022/0115470 A1* | 4/2022 | Kim | H01L 27/1214 |
| 2022/0140186 A1* | 5/2022 | Min | H01L 25/167 |
| | | | 257/79 |
| 2022/0216179 A1* | 7/2022 | Yang | H01L 25/0753 |
| 2022/0278253 A1* | 9/2022 | Yang | H01L 33/62 |

FOREIGN PATENT DOCUMENTS

| KR | 10-2019-0029831 | 3/2019 |
|---|---|---|
| KR | 10-2020-0060638 | 6/2020 |

* cited by examiner

DISPLAY DEVICE AND METHOD OF FABRICATING THE SAME

CROSS-REFERENCE TO RELATED APPLICATION(S)

This application claims priority to and benefits of Korean Patent Application No. 10-2020-0106812 under 35 U.S.C. § 119, filed on Aug. 25, 2020 in the Korean Intellectual Property Office, the entire contents of which are incorporated herein by reference.

BACKGROUND

1. Technical Field

The disclosure relates to a display device and a method of fabricating the same.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices are for displaying images and may include a display panel such as an organic light-emitting display panel or a liquid-crystal display panel. Among display devices, light-emitting display panels may include light-emitting elements. For example, light-emitting diodes (LEDs) may include an organic light-emitting diode (OLED) using an organic material as a fluorescent material, or an inorganic light-emitting diode using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a method of fabricating a display device by which the fabricating cost can be saved and the process can become easier by way of omitting a mask process. Aspects of the disclosure also provide a display device fabricated by the method.

It should be noted that aspects of the disclosure are not limited to the above. Additional aspects will be apparent to those skilled in the art from the following descriptions.

According to the display device and the method of fabricating the same according to embodiments, a first opening may be formed in the first insulating layer, so that a light-emitting element can be easily seated in the first opening. By forming a second insulating layer covering the light-emitting element and the contact electrodes, it may be possible to fix the light-emitting element and the contact electrodes. The display device can be fabricated by forming the second insulating layer, a mask can be reduced by omitting the process of individually patterning multiple insulating layers or electrodes.

It should be noted that effects of the disclosure are not limited to those described above and other effects of the disclosure will be apparent to those skilled in the art from the following descriptions.

According to an embodiment of the disclosure, a display device may comprise a planarization layer disposed on a substrate, a first alignment electrode and a second alignment electrode that extend in a first direction and are spaced apart from each other on the planarization layer, a first insulating layer disposed on the first alignment electrode and the second alignment electrode, the first insulating layer comprising a first opening exposing the planarization layer between the first alignment electrode and the second alignment electrode, a light-emitting element disposed on the planarization layer overlapping the first opening, a first contact electrode and a second contact electrode disposed on the first insulating layer, the first contact electrode electrically contacting a first end of the light-emitting element and the second contact electrode electrically contacting a second end of the light-emitting element, and a second insulating layer disposed on the light-emitting element.

In an embodiment, the first alignment electrode, the second alignment electrode and the light-emitting element may be disposed on a same layer and spaced apart from each other, and may contact the planarization layer.

In an embodiment, an end of the first alignment electrode may face the first end of the light-emitting element, and an end of the second alignment electrode may face the second end of the light-emitting element.

In an embodiment, the first contact electrode may be disposed between an end of the first alignment electrode and the first end of the light-emitting element, and the second contact electrode may be disposed between an end of the second alignment electrode and the second end of the light-emitting element.

In an embodiment, the first insulating layer may comprise second openings exposing the first alignment electrode and the second alignment electrode, the first contact electrode may electrically contact the first alignment electrode through one of the second openings, and the second contact electrode may electrically contact the second alignment electrode through another one of the second openings.

In an embodiment, the first opening and the second openings may extend parallel to the first alignment electrode.

In an embodiment, the second insulating layer may overlap the first opening and may extend parallel to the first alignment electrode.

In an embodiment, the second insulating layer may not overlap the first alignment electrode and the second alignment electrode, and may have an isolated pattern.

In an embodiment, a width of the second insulating layer may be smaller than a width of the first opening and larger than a length of the light-emitting element in a second direction perpendicular to the first direction.

In an embodiment, the second insulating layer may overlap all of the first contact electrode, the second contact electrode, and the light-emitting element.

In an embodiment, the second insulating layer may overlap the light-emitting element and may not overlap the first contact electrode and the second contact electrode.

According to an embodiment of the disclosure, a display device may comprise a planarization layer disposed on a substrate, a first alignment electrode and a second alignment electrode that extend in a first direction and are spaced apart from each other on the planarization layer, a first insulating layer disposed on the first alignment electrode and the second alignment electrode, the first insulating layer comprising a groove located between the first alignment electrode and the second alignment electrode, a light-emitting element disposed on the first insulating layer and overlapping the groove, a first contact electrode and a second contact electrode disposed on the first insulating layer, the first contact electrode electrically contacting a first end of the light-emitting element and the second contact electrode electrically contacting a second end of the light-emitting element, and a second insulating layer disposed on the light-emitting element.

In an embodiment, the groove may be a portion of the first insulating layer that may be thinner than other portions of the first insulating layer.

In an embodiment, the light-emitting element may be spaced apart from sidewalls of the groove, the first contact electrode may be disposed between one of the sidewalls of the groove and the first end of the light-emitting element, and the second contact electrode may be disposed between another one of the sidewalls of the groove and the second end of the light-emitting element.

In an embodiment, a depth of the groove may be about 50% or more of a thickness of the light-emitting element.

In an embodiment, the second insulating layer may not overlap the first alignment electrode and the second alignment electrode, and may have an isolated pattern.

In an embodiment, a width of the second insulating layer may be smaller than a width of the groove and larger than a length of the light-emitting element in a second direction perpendicular to the first direction.

According to an embodiment of the disclosure, a method of manufacturing a display device may comprise preparing a substrate comprising a planarization layer, forming a first alignment electrode and a second alignment electrode on the substrate, forming a first insulating layer on the substrate, removing the first insulating layer between the first alignment electrode and the second alignment electrode to form a first opening exposing the planarization layer, aligning the light-emitting element in the first opening, forming a first contact electrode and a second contact electrode on the first insulating layer, the first contact electrode electrically contacting a first end of the light-emitting element and the second contact electrode electrically contacting a second end of the light-emitting element, and forming a second insulating layer on the light-emitting element.

In an embodiment, the method may further comprise forming second openings to expose the first alignment electrode and the second alignment electrode, wherein the forming of the first opening and the forming of the second openings are simultaneously performed.

In an embodiment, the light-emitting element may be aligned in contact with the planarization layer within the first opening.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
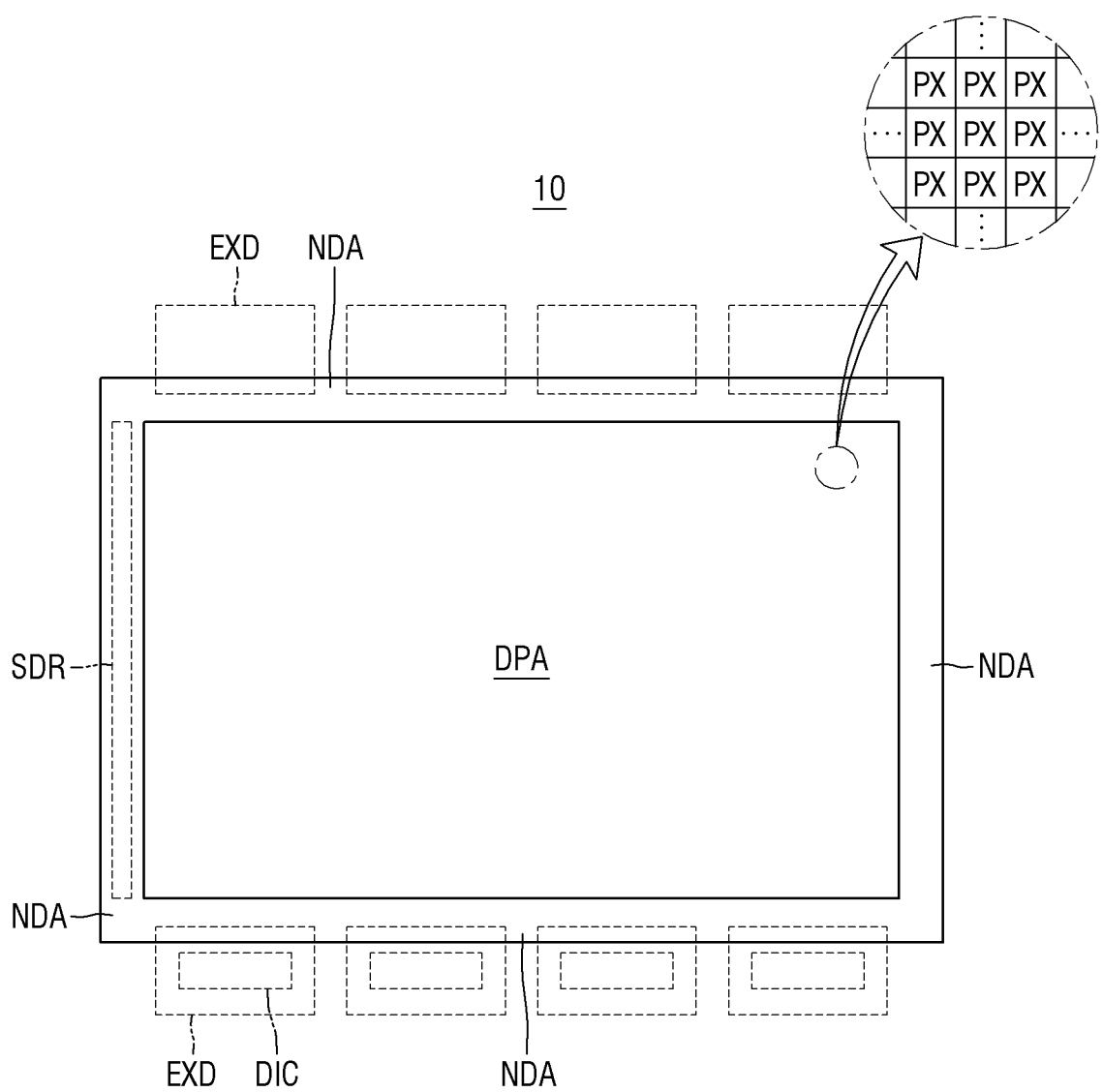
FIG. 1 is a schematic plan view of a display device according to an embodiment of the disclosure.

The disclosure will now be described more fully hereinafter with reference to the accompanying drawings, in which embodiments are shown. Concepts of the disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

As used herein, the singular forms, "a," "an," and "the" are intended to include the plural forms as well, unless the context clearly indicates otherwise, and vice versa.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

In the drawings, sizes, thicknesses, ratios, and dimensions of the elements may be exaggerated for ease of description and for clarity. It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving may be possible. Each embodiment may be implemented independently of each other or may be implemented together in an association.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as "not overlapping" or "to not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view of a display device according to an embodiment of the disclosure.

Referring to FIG. 1, the display device 10 may display a moving image or a still image. The display device 10 may refer to any electronic device that provides a display screen. For example, the display device 10 may include a television set, a laptop computer, a monitor, an electronic billboard, an Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, a digital camera, a camcorder, etc.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the disclosure is not limited thereto. Any other display panel may be employed as long as the technical idea of the disclosure may be applied.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc. The shape of a display area DPA of the display device 10 may also be similar to the overall shape of the display device 10. FIG. 1 shows the display device 1 in the shape of a rectangle with longer horizontal sides and the display area DPA.

The display device 10 may include the display area DPA and non-display areas NDA. In the display area DPA, images can be displayed. In the non-display areas NDA, images may not be displayed. The display area DPA may be referred to as an active area, while the non-display areas NDA may also be referred to as an inactive area. The display area DPA may generally occupy the center of the display device 10.

The display area DPA may include pixels PX. The pixels PX may be arranged in a matrix. The shape of each pixel PX may be, but is not limited to, a rectangle or a square when viewed from the top. Each pixel may have a diamond shape having sides inclined with respect to a direction. The pixels PX may be arranged in stripes and PenTile® pattern alternately. Each of the pixels PX may include at least one light-emitting element 30 (FIG. 4) that emits light of a particular wavelength band to represent a color.

The non-display areas NDA may be disposed around the display area DPA. The non-display areas NDA may surround the display area DPA entirely or partially. The display area DPA may have a rectangular shape, and the non-display areas NDA may be disposed to be adjacent to the four sides of the display area DPA. The non-display areas NDA may form the bezel of the display device 10.

In the non-display areas NDA, a driving circuit or a driving element for driving the display area DPA may be disposed. According to an embodiment of the disclosure, pad areas may be disposed on the display substrate of the display device 10 in a non-display area NDA disposed adjacent to a first longer side (the lower side in FIG. 10) of the display device 1 and a non-display area NDA adjacent to a second longer side (the upper side in FIG. 1) of the display device 1. External devices EXD may be mounted on pad electrodes of the pad areas. Examples of the external devices EXD may include a connection film, a printed circuit board, a driver chip DIC, a connector, a line connection film, etc. A scan driver SDR formed directly on the display substrate of the display device 10 or the like may be disposed in the non-display area NDA disposed adjacent to a first shorter side of the display device 1 (the left side in FIG. 1).

Figure 2:
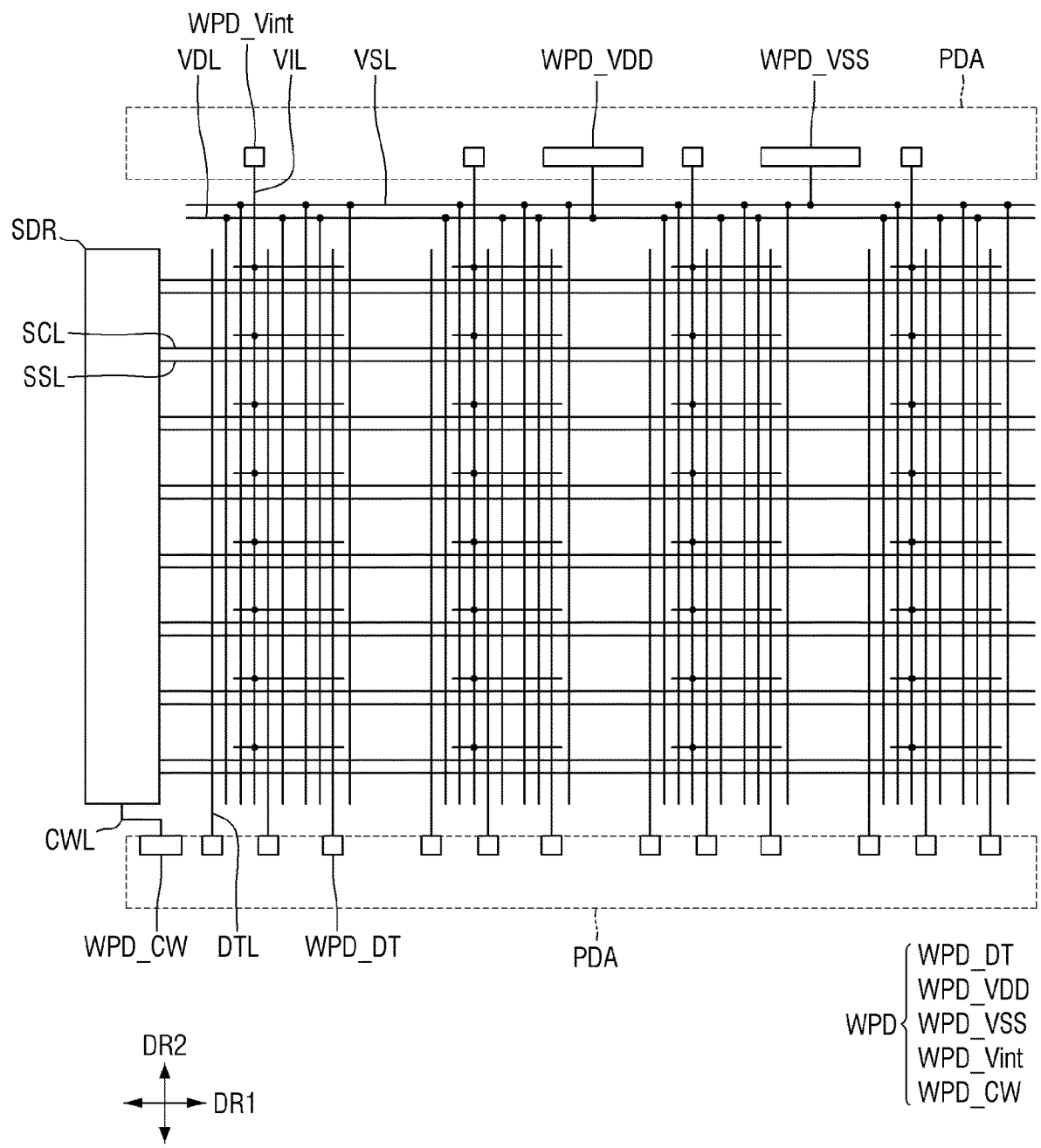
FIG. 2 is a layout diagram schematically showing lines that may be included in a display device according to an embodiment of the disclosure.

FIG. 2 is a layout diagram schematically showing lines that may be included in a display device according to an embodiment of the disclosure.

Referring to FIG. 2, the display device 10 may include lines. The lines may include a scan line SCL, a sensing line SSL, a data line DTL, an initialization voltage line VIL, a first voltage line VDL, a second voltage line VSL, etc.

Although not shown in FIG. 2, other lines may be further disposed in the display device 10.

The scan line SCL and the sensing line SSL may be extended in the first direction DR1. The scan line SCL and the sensing line SSL may be connected to the scan driver SDR. The scan driver SDR may include a driving circuit. The scan driver SDR may be disposed on, but is not limited to, a side of the display area DPA in the first direction DR1. The scan driver SDR may be connected to a signal connection line CWL, and at least one end of the signal connection line CWL may form a pad WPD_CW on the non-display area NDA to be connected to an external device.

As used herein, when an element is referred to as being "connected" or "coupled" to another element, it can be directly connected or coupled to the element or intervening elements may be present. Such elements may be understood as a single integrated element and thus one portion thereof may be connected to another portion. Moreover, when an element is referred to as being "connected" to another element, it may be in direct contact with the element and also electrically connected to the element.

The data line DTL and the initialization voltage line VIL may be extended in a second direction DR2 intersecting the first direction DR1. The initialization voltage line VIL may further include branches as well as the portion extended in the second direction DR2. Each of the first voltage line VDL and the second voltage line VSL may also include portions extended in the second direction DR2 and portions connected thereto and extended in the first direction DR1. The first voltage line VDL and the second voltage line VSL may have, but are not limited to, a mesh structure. Although not shown in FIG. 2, each of the pixels PX of the display device 10 may be connected to at least one data line DTL, the initialization voltage line VIL, the first voltage line VDL, and the second voltage line VSL.

The data line DTL, the initialization voltage line VIL, the first voltage line VDL and the second voltage line VSL may be electrically connected to one or more wire pads WPD. The wire pads WPD may be disposed in the non-display areas NDA. According to an embodiment of the disclosure, a wire pad WPD_DT of the data line DTL (hereinafter referred to as a data pad) may be disposed in the pad area PDA on a side of the display area DPA in the second direction DR2, and a wire pad WPD_Vint of the initialization voltage line VIL (hereinafter referred to as an initialization voltage pad), a wire pad WPD_VDD of the first voltage line VDL (hereinafter referred to as a first power pad), and a wire pad WPD_VSS of the second voltage line VSL (hereinafter referred to as a power pad) may be disposed in the pad area PDA located on another side of the display area DPA in the second direction DR2. As another example, the data pad WPD_DT, the initialization voltage pad WPD_Vint and the first supply voltage pad WPD_VDD and the second supply voltage pad WPD_VSS may all be disposed in a same area, e.g., in the non-display area NDA on the upper side of the display area DPA. External devices EXD may be mounted on the wire pads WPD. The external device EXD may be mounted on the wire pads WPD by an anisotropic conductive film, ultrasonic bonding, etc.

Each of the pixels PX or sub-pixels PXn of the display device 10 may include a pixel driving circuit, where n may be an integer of 1 to 3. The above-described lines may pass through the pixels PX or the periphery thereof to apply driving signals to the pixel driving circuits. The pixel driving circuit may include a transistor and a capacitor. The numbers of transistors and capacitors of each pixel driving circuit may be changed in a variety of ways. According to an embodiment of the disclosure, each of the sub-pixels PXn of the display device 10 may have a 3T1C structure, e.g., a pixel driving circuit may include three transistors and a capacitor. In the following description, the pixel driving circuit having the 3T1C structure will be described as an example. It is, however, to be understood that the disclosure is not limited thereto. A variety of modified pixel structure may be employed such as a 2T1C structure, a 7T1C structure and a 6T1C structure.

Figure 3:
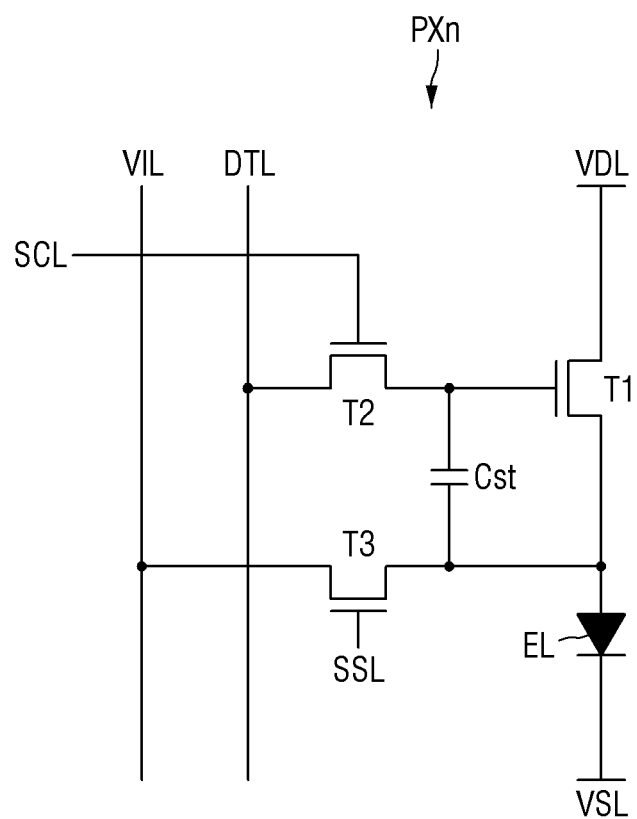
FIG. 3 is a schematic circuit diagram of a sub-pixel according to an embodiment of the disclosure.

FIG. 3 is a schematic circuit diagram of a sub-pixel according to an embodiment of the disclosure.

Referring to FIG. 3, each of the sub-pixels PXn of the display device 10 according to an embodiment may include three transistors T1, T2 and T3 and a storage capacitor Cst in addition to a light-emitting diode EL.

The light-emitting diode EL may emit light in proportional to the current supplied through the first transistor T1. The light-emitting diode EL may include a first electrode, a second electrode, and at least one light-emitting element disposed therebetween. The light-emitting element may emit light in a particular wavelength range by an electric signal transmitted from the first electrode and the second electrode.

An end of the light-emitting diode EL may be connected to a source electrode of the first transistor T1, and another end thereof may be connected to the second voltage line VSL from which a low-level voltage (hereinafter referred to as a second supply voltage) lower than a high-level voltage (hereinafter referred to as a first supply voltage) of the first voltage line VDL may be applied.

The first transistor T1 may adjust a current flowing from the first supply voltage line VDL from which the first supply voltage may be supplied to the light-emitting diode EL according to the voltage difference between a gate electrode and the source electrode. For example, the first transistor T1 may be a driving transistor for driving the light-emitting diode EL. The gate electrode of the first transistor T1 may be connected to a source electrode of the third transistor T3, the source electrode thereof may be connected to the first electrode of the light-emitting diode EL, and the drain electrode thereof may be connected to the first voltage line VDL from which the first supply voltage may be applied.

The second transistor T2 may be turned on by a scan signal of the scan line SCL to connect the data line DTL to the gate electrode of the first transistor T1. The gate electrode of the second transistor T2 may be connected to the scan line SCL, the source electrode thereof may be connected to the gate electrode of the first transistor T1, and the drain electrode thereof may be connected to the data line DTL.

The third transistor T3 may be turned on by a sensing signal of the sensing line SSL to connect the initialization voltage line VIL to an end of the light-emitting diode EL. The gate electrode of the third transistor T3 may be connected to the sensing line SSL, the drain electrode thereof may be connected to the initialization voltage line VIL, and the source electrode thereof may be connected to an end of the light-emitting diode EL or the source electrode of the first transistor T1.

The source electrode and the drain electrode of each of the transistors T1, T2 and T3 are not limited to those described above. They may be connected in the opposite way.

The storage capacitor Cst may be formed between the gate electrode and the source electrode of the first transistor T1. The storage capacitor Cst may store a voltage difference between the gate voltage and the source voltage of the first transistor T1.

Each of the transistors T1, T2 and T3 may be formed as a thin-film transistor. Although each of the transistors T1, T2 and T3 may be implemented as an n-type MOSFET (metal oxide semiconductor field effect transistor) in the example shown in FIG. 3, the disclosure is not limited thereto. That is to say, each of the transistors T1, T2 and T3 may be implemented as a p-type MOSFET, or some of the transistors T1, T2 and T3 may be implemented as n-type MOSFETs while others may be implemented as p-type MOSFETs.

Figure 4:
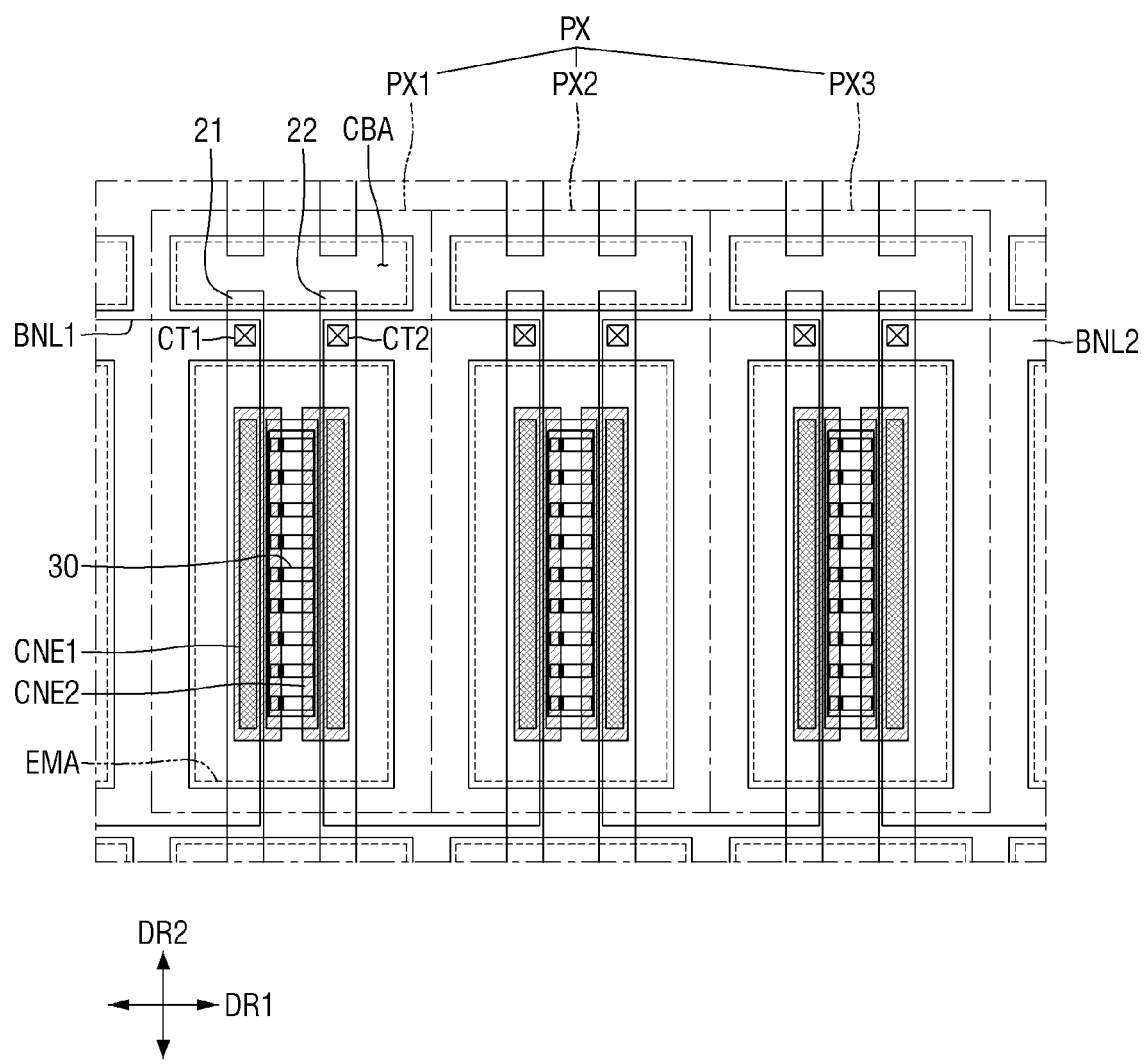
FIG. 4 is a schematic plan view showing a pixel of a display device according to an embodiment of the disclosure.

FIG. 4 is a schematic plan view showing a pixel of a display device according to an embodiment of the disclosure.

Referring to FIG. 4, each of the pixels PX may include sub-pixels PXn, where n may be an integer from one to three. For example, a pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. It is, however, to be understood that the disclosure is not limited thereto. All the sub-pixels PXn may emit light of a same color. Although the pixel PX includes three sub-pixels PXn in the example shown in FIG. 4, the disclosure is not limited thereto. The pixel PX may include more than two sub-pixels PXn.

Each of the sub-pixels PXn of the display device 10 may include an emission area EMA and a non-emission area (not shown). In the emission area EMA, the light-emitting elements 30 may be disposed to emit light of a particular wavelength. In the non-emission area, no light-emitting element 30 may be disposed and light emitted from the light-emitting elements 30 may not reach and thus no light exits therefrom. The emission area may include an area in which the light-emitting elements 30 may be disposed, and may include an area adjacent to the light-emitting elements 30 where light emitted from the light-emitting element 30 exit.

It is, however, to be understood that the disclosure is not limited thereto. The emission area EMA may also include an area in which light emitted from the light-emitting element 30 may be reflected or refracted by other elements to exit. The light-emitting elements 30 may be disposed in each of the sub-pixels PXn, and the emission area EMA may include the area where the light-emitting elements may be disposed and adjacent areas.

Each of the sub-pixels PXn may further include a cut area CBA disposed in the non-emission area. The cut area CBA may be disposed on a side of the emission area EMA in the second direction DR2. The cut area CBA may be disposed between the emission areas EMA of neighboring sub-pixels PXn in the second direction DR2. In the display area DPA of the display device 10, emission areas EMA and cutout areas CBA may be arranged. For example, the emission areas EMA and the cutout areas CBA may be arranged repeatedly in the first direction DR1, and may be arranged alternately in the second direction DR2. The spacing between the cutout areas CBA in the first direction DR1 may be smaller than the spacing between the emission areas EMA in the first direction DR1. A second bank BNL2 may be disposed between the cutout regions CBA and the emission areas EMA, and the distance between them may vary depending on the width of the second bank BNL2. Although the light-emitting elements 30 may not be disposed in the cut areas CBA and thus no light exits therefrom, parts of alignment electrodes 21 and 22 disposed in each of the sub-pixels PXn may be disposed there. The alignment electrodes 21 and 22 disposed for each of the sub-pixels PXn may be disposed separately from each other in the cut area CBA. It is, however, to be understood that the disclosure is not limited thereto. The electrodes 21 and 22 may not be disposed separately in the cut area CBA.

Figure 5:
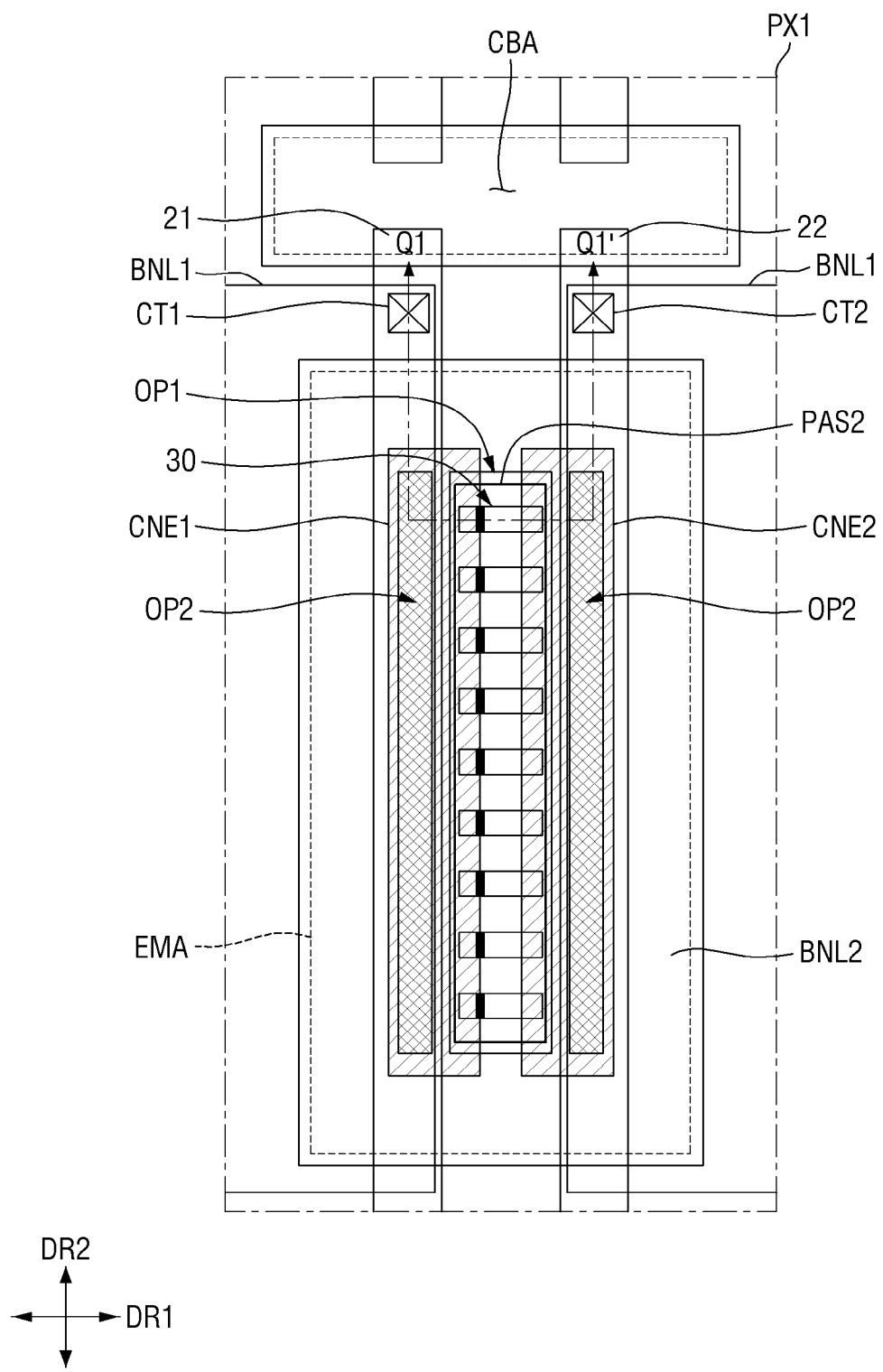
FIG. 5 is a schematic plan view showing a sub-pixel of FIG. 4.
Figure 6:
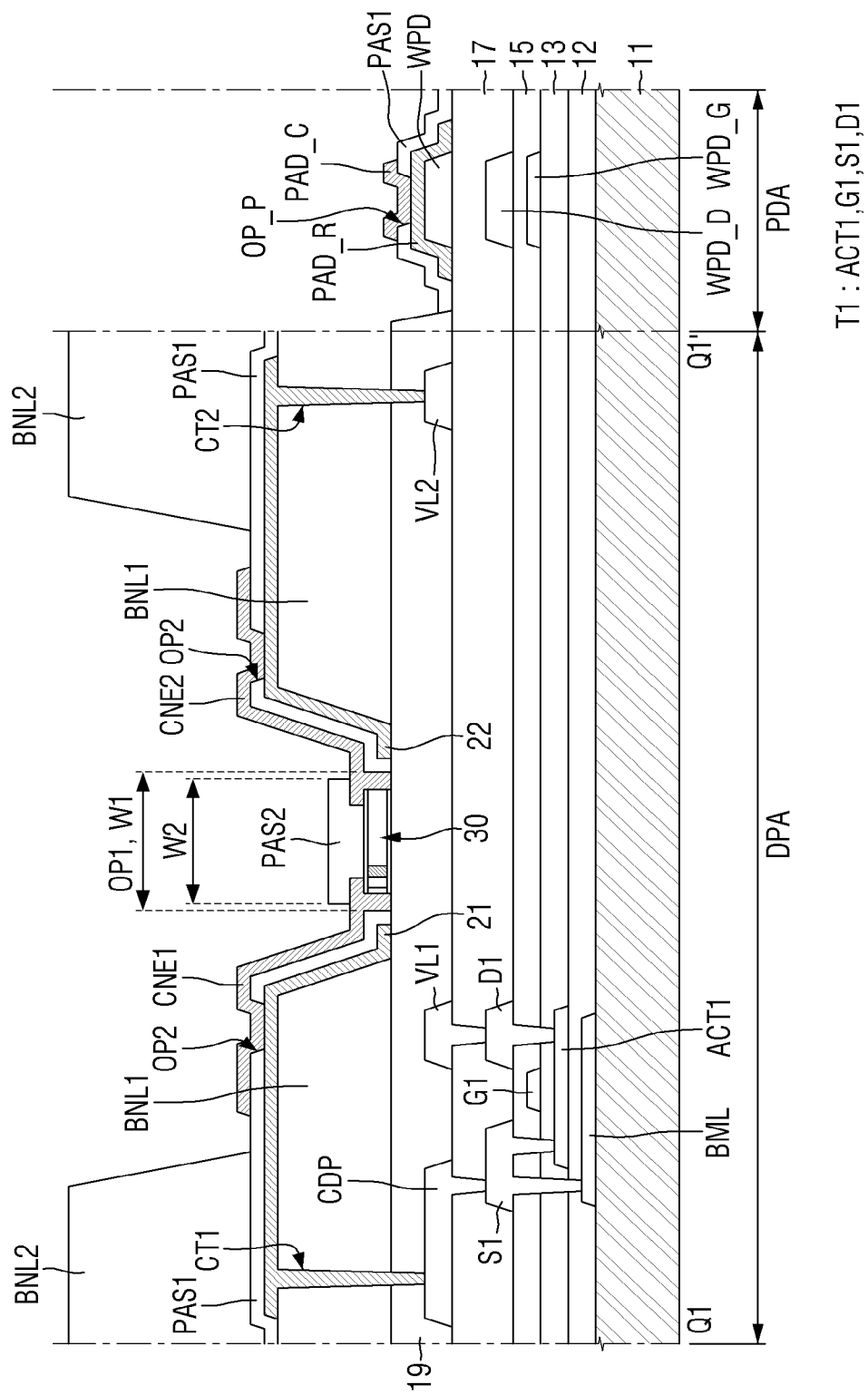
FIG. 6 is a schematic cross-sectional view taken along line Q1-Q1' of FIG. 5 as well as a portion of a pad area.
Figure 7:
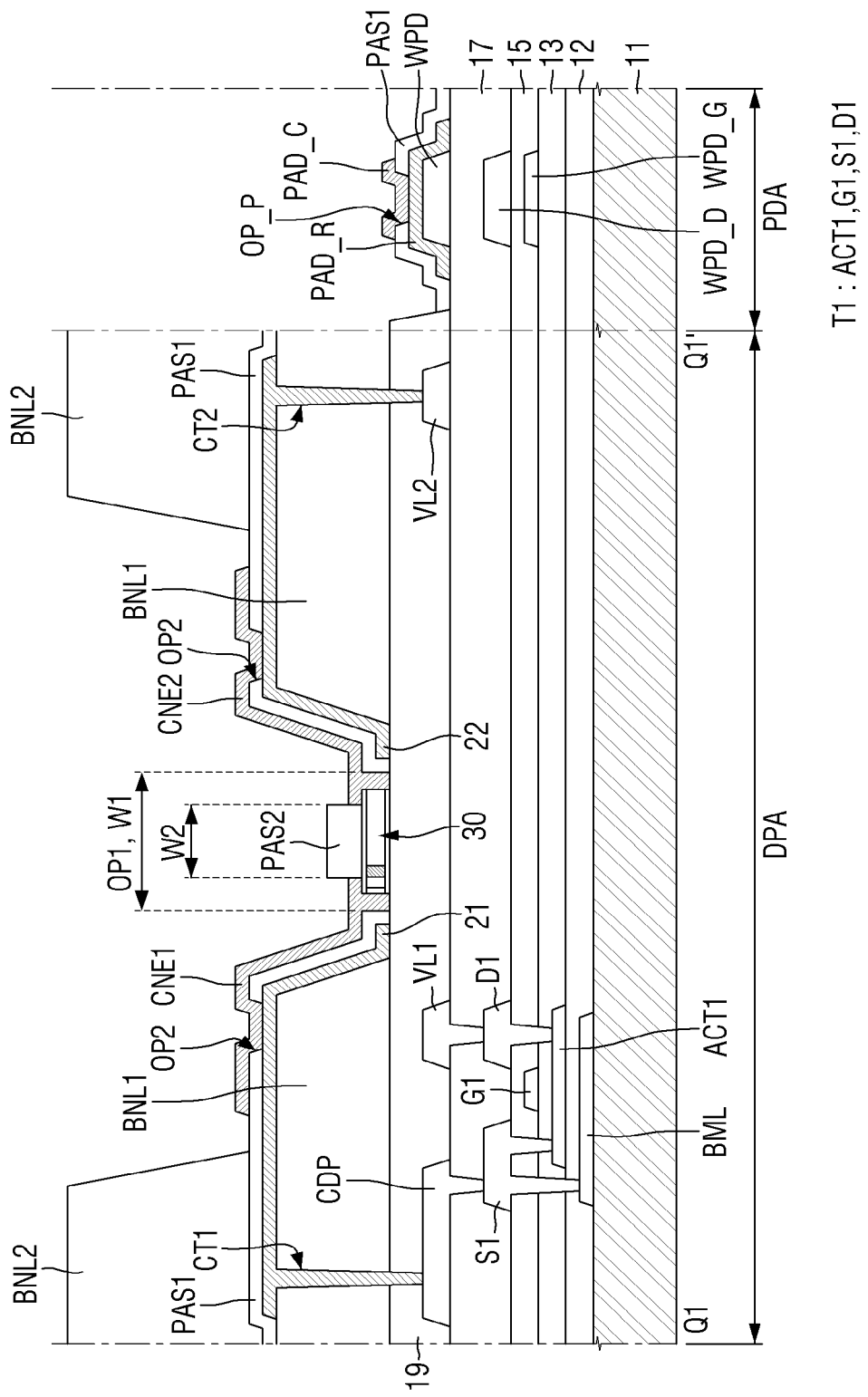
FIG. 7 is a schematic cross-sectional view showing another example of a display device according to an embodiment of the disclosure.
Figure 8:
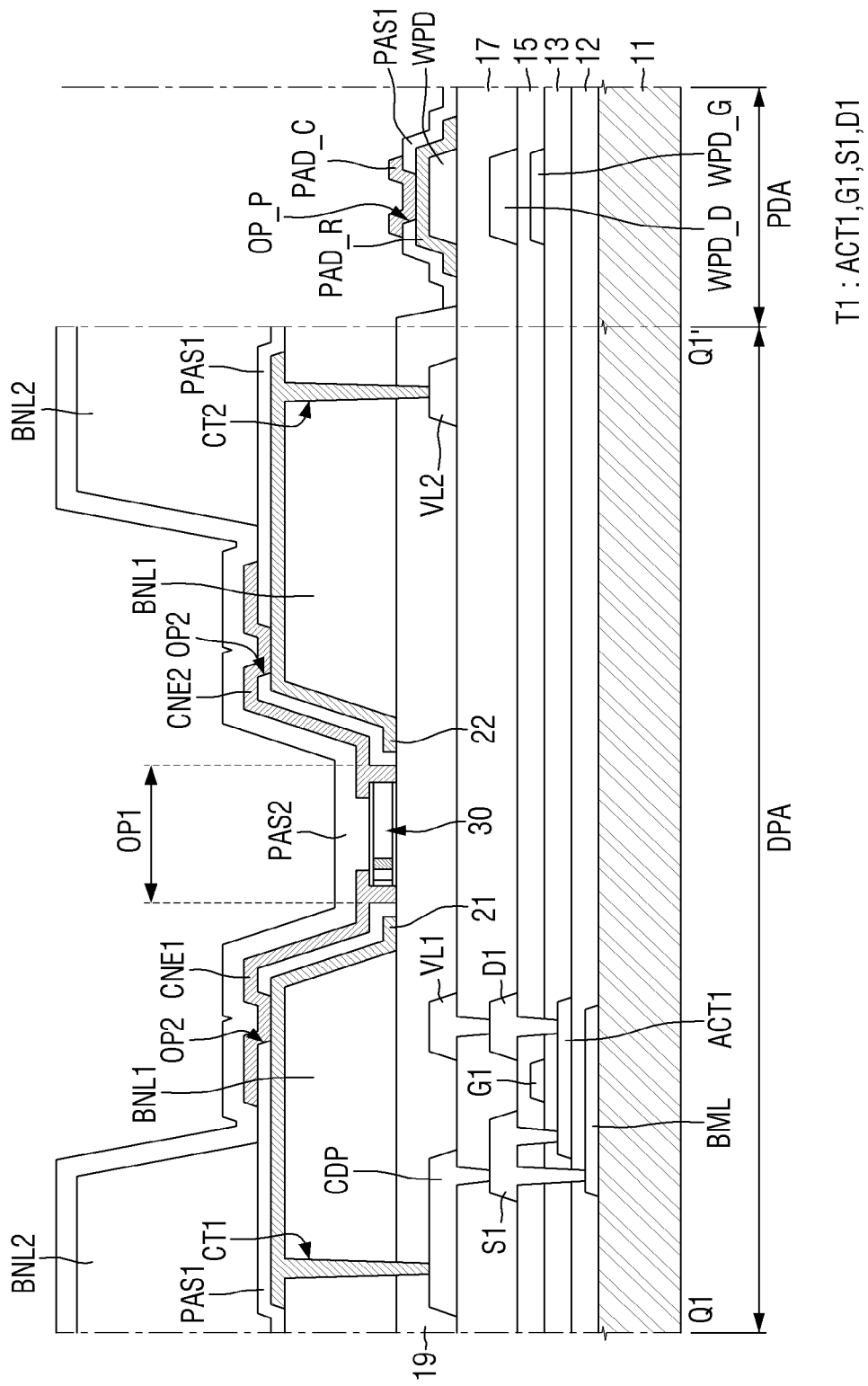
FIG. 8 is a schematic cross-sectional view showing yet another example of the display device according to the embodiment of the disclosure.

FIG. 5 is a schematic plan view showing a sub-pixel of FIG. 4. FIG. 6 is a schematic cross-sectional view taken along line Q1-Q1' of FIG. 5 as well as a portion of a pad area. FIG. 7 is a schematic cross-sectional view showing another example of a display device according to an embodiment of the disclosure. FIG. 8 is a schematic cross-sectional view showing yet another example of the display device according to an embodiment of the disclosure.

The cross-sectional view of FIG. 6 shows arrangements of alignment electrodes 21 and 22, a light-emitting element 30 and contact electrodes CNE1 and CNE2 disposed in the emission area EMA along with pad electrode PAD_R and PAD_C in the pad area PDA in a sub-pixel PXn of the display area DPA. Although only one first transistor T1 is shown in FIG. 6, the disclosure is not limited thereto. Three transistors T1, T2 and T3 and a storage capacitor Cst may be disposed in each of the sub-pixels PXn as described above. FIGS. 5 and 6 are diagrams for showing relative arrangements between the elements disposed in the display area DPA and the pad area PDA. It is, however, to be understood that the structure of the display device 10 is not limited thereto.

Referring to FIGS. 5 and 6 in conjunction with FIG. 4, the display device 10 may include a first substrate 11, a semiconductor layer disposed on the first substrate 11, conductive layers, and insulating layers. The semiconductor layer, the conductive layers and the insulating layers may form a circuit layer and an emission material layer of the display device 10.

Specifically, the first substrate 11 may be an insulating substrate. The first substrate 11 may be made of an insulating material such as glass, quartz, a polymer resin, or a combination thereof. The first substrate 11 may be either a rigid substrate or a flexible substrate that can be bent, folded, or rolled. The first substrate 11 may include the display area DPA and the pad area NDA.

A light-blocking layer BML may be disposed on the first substrate 11. The light-blocking layer BML may overlap an active layer ACT1 of the first transistor T1 of the display area DPA. The light-blocking layer BML may include a material that blocks light, and thus can prevent light from entering the active layer ACT1 of the first transistor T1. The light-blocking layer BML may be electrically connected to the source electrode S1 of the first transistor T1 through a contact hole to suppress a change in the voltage of the first transistor T1. For example, the light-blocking layer BML may be formed of an opaque metal material that blocks light transmission, and may be made up of a Ti/Cu double layer in which a titanium layer and a copper layer may be stacked. It is, however, to be understood that the disclosure is not limited thereto. In some implementations, the light-blocking layer BML may be eliminated.

The buffer layer 12 may be disposed entirely on the first substrate 11, including the light-blocking layer BML. Specifically, the buffer layer 12 may be disposed across the display area DPA and the pad area PDA of the first substrate 11. The buffer layer 12 may be formed on the first substrate 11 to protect the first thin-film transistors T1 of the pixels PX from moisture permeating through the first substrate 11 that may be susceptible to moisture permeation, and may also provide a flat surface. The buffer layer 12 may be formed of inorganic layers stacked on one another alternately. For example, the buffer layer 12 may be made up of multiple layers in which inorganic layers including at least one of a silicon oxide (SiOx), a silicon nitride (SiNx) and silicon oxynitride (SiOxNy) may be stacked on one another alternately.

The semiconductor layer may be disposed on the buffer layer 12. The semiconductor layer may include the active layer ACT1 of the first transistor T1 disposed in the display area DPA. These may be disposed to partially overlap a gate electrode G1 of a first gate conductive layer, etc., which will be described later.

The semiconductor layer may include polycrystalline silicon, monocrystalline silicon, an oxide semiconductor, etc., or a combination thereof. In case that the semiconductor layer includes an oxide semiconductor, each active layer ACT1 may include conductive regions and a channel region therebetween. The oxide semiconductor may be an oxide semiconductor containing indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), etc., or a combination thereof.

In other embodiments, the semiconductor layer may include polycrystalline silicon. The polycrystalline silicon may be formed by crystallizing amorphous silicon, and in such case, the conductive regions of the active layer ACT1 may be doped regions doped with impurities.

The first gate insulating layer 13 may be disposed on the semiconductor layer and the buffer layer 12 across the display area DPA and the pad area PDA. The first gate insulating layer 13 may work as a gate insulator of each of the thin-film transistors. The first gate insulating layer 13 may be formed of an inorganic layer including an inorganic material, such as at least one of silicon oxide (SiOx), silicon nitride (SiNx) and silicon oxynitride (SiOxNy), or may be formed of a stack of the materials.

The first gate conductive layer may be disposed on the first gate insulating layer 13. The first gate conductive layer may include a gate electrode G1 of the first transistor T1 disposed in the display area DPA and a gate pad WPD_G disposed in the pad area PDA. The gate electrode G1 may be disposed so that it overlaps the channel region of the active layer ACT1 in the thickness direction.

Although not shown in FIG. 6, the first gate conductive layer may further include a first capacitance electrode of the storage capacitor disposed in the display area DPA, the above-described scan line SCL, the sensing line SSL, etc.

According to an embodiment of the disclosure, the first gate conductive layer may include the gate pad WPD_G disposed in the pad area PDA. Wire pads WPD may be disposed in the pad area PDA located on a side of the non-display area NDA of the display device 10. The wires pads WPD may be connected to the external device EXD mounted thereon through the pad electrodes PAD_R and PAD_C. The gate pad WPD_G may be electrically connected to the wire pads WPD. For example, although not shown in FIG. 6, the wire pads WPD may be connected to the gate pad WPD_G through a contact hole. Electric signals applied from the external device EXD to the wire pads WPD may be transmitted to the first gate conductive layer through the gate pad WPD_G. Electrical signals applied to the display area DPA through the wire pads WPD may be transmitted through a conductive layer disposed on a different layer from the wire pads WPD, so that the display area DPA can be completely sealed from outside air. It is, however, to be understood that the disclosure is not limited thereto. The gate pad WPD_G of the first gate conductive layer may be eliminated.

The first gate conductive layer may be made up of a single layer or multiple layers of at least one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first interlayer dielectric layer 15 may be disposed on the first gate conductive layer. The first interlayer dielectric layer 15 may serve as an insulating layer between the first gate conductive layer and other layers disposed thereon. The first interlayer dielectric layer 15 may be disposed so that it covers the first gate conductive layer to protect it. The first interlayer dielectric layer 15 may be formed of an inorganic layer including an inorganic material, such as at least one of silicon oxide (SiOx), silicon nitride (SiNx) and silicon oxynitride (SiOxNy), or may be formed of a stack of the materials.

The first data conductive layer may be disposed on the first interlayer dielectric layer 15. The first data conductive layer may include the source electrode S1 and the drain electrode D1 of the first transistor T1 disposed in the display area DPA, and a data pad WPD_D disposed in the pad area PDA.

The source electrode S1 and the drain electrode D1 of the first transistor T1 may electrically contact the doping regions of the active layer ACT1, respectively, through the contact holes penetrating through the first interlayer dielectric layer 15 and the first gate insulating layer 13. The source electrode S1 of the first transistor T1 may be electrically connected to the light-blocking layer BML through another contact hole.

Although not shown in FIG. 6, the first data conductive layer may further include a second capacitance electrode of the storage capacitor disposed in the display area DPA, the above-described data line DTL, etc.

According to an embodiment of the disclosure, the first data conductive layer may include the data pad WPD_D disposed in the pad area PDA. Similarly to the gate pad WPD_G, the data pad WPD_D may be electrically connected to the wire pads WPD. For example, although not shown in FIG. 6, the wire pads WPD may be connected to the data pad WPD_D through a contact hole, and an electrical signal applied from the external device EXD to the wire pads WPD may be transmitted to the first data conductive layer. It is, however, to be understood that the disclosure is not limited thereto. The data pad WPD_D of the first data conductive layer may be eliminated.

The first data conductive layer may be made up of a single layer or multiple layers of at least one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The second interlayer dielectric layer 17 may be disposed on the first data conductive layer. The second interlayer dielectric layer 17 may serve as an insulating layer between the first data conductive layer and other layers disposed thereon. The second interlayer dielectric layer 17 may cover the first data conductive layer to protect it. The second interlayer dielectric layer 17 may be formed of an inorganic layer including an inorganic material, such as at least one of silicon oxide (SiOx), silicon nitride (SiNx) and silicon oxynitride (SiOxNy), or may be formed of a stack of the materials.

The second data conductive layer may be disposed on the second interlayer dielectric layer 17. The second data conductive layer may include a first voltage line VL1, a second voltage line VL2 and a first conductive pattern CDP disposed in the display area DPA, and the wire pads WPD disposed in the pad area PDA. A high-level voltage (or a first supply voltage) may be applied to the first voltage line VL1 to be supplied to the first transistor T1, and a low-level voltage (or a second supply voltage) may be applied to the second voltage line VL2 to be supplied to the second alignment electrode 22. An alignment signal necessary for aligning the light-emitting elements 30 during the process of fabricating the display device 10 may be applied to the second voltage line VL2.

The first conductive pattern CDP may be connected to the source electrode S1 of the first transistor T1 through a contact hole formed in the second interlayer dielectric layer 17. The first conductive pattern CDP may be electrically connected to the first drain electrode D1 and may also electrically contact the first alignment electrode 21 to be described later. The first transistor T1 may transmit the first supply voltage applied from the first voltage line VL1 to the first alignment electrode 21 through the first conductive pattern CDP. Although the second data conductive layer may include one second voltage line VL2 and one first voltage line VL1 in the example shown in the drawings, the disclosure is not limited thereto. The second data conductive layer may include more than one first voltage lines VL1 and second voltage lines VL2.

The wire pad WPD may be disposed in the pad area PDA and connected to the external device EXD mounted thereon. According to an embodiment of the disclosure, the wire pad WPD may be connected to the external device EXD through pad electrodes PAD_R and PAD_C disposed thereon. A first planarization layer 19 may be further disposed on the second data conductive layer. However, the first planarization layer 19 may not be disposed on the wire pad WPD and thus the wire pad WPD may be exposed. In the display device 10 according to an embodiment, pad electrodes PAD_R and PAD_C for capping the wire pads WPD and connecting them with the external devices EXD, and an insulating layer (e.g., a first passivation layer PAS1) may be formed of a same layer as the layer disposed in the display area DPA. In the display device 10, multiple layers may be stacked on one another, including a circuit layer comprising conductive layers and a display element layer disposed thereon. In the display device 10 according to an embodiment of the disclosure, the pad electrodes PAD_R and PAD_C disposed in the pad area PDA may be formed via a same process as the layer disposed in the display area DPA, and some of the processes of fabricating the display device 10 can be performed together at different operations, thereby reducing the number of unnecessary processes. A more detailed description thereon will be given later.

The second data conductive layer may be made up of a single layer or multiple layers of at least one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first planarization layer 19 may be disposed over the second data conductive layer. The first planarization layer 19 may be disposed entirely in the display area DPA to provide a flat surface. The first planarization layer 19 may include an organic insulating material, e.g., an organic material such as polyimide (PI). In the pad area PDA, the first planarization layer 19 may not be disposed so that the wire pads WPD may not be exposed or may be disposed on only a part thereof. In some embodiments, the first planarization layer 19 may be eliminated.

On the first planarization layer 19 in the display area DPA, first banks BNL1, alignment electrodes 21 and 22, a light-emitting element 30, contact electrodes CNE1 and CNE2, and a second bank BNL2 may be disposed. Insulating layers PAS1 and PAS2 may be disposed on the first planarization layer 19. In the pad area PDA, the pad electrodes PAD_R and PAD_C and the passivation layer PAS1 may be disposed on the wire pad WPD. Hereinafter, the display element layer disposed in the display area DPA will be first described, and the wire pad WPD and the pad electrodes PAD_R and PAD_C disposed in the pad area PDA will be described.

The first banks BNL1 may be disposed in the display area DPA of the first substrate 11. For example, the first banks BNL1 may be disposed on the first planarization layer 19. The first banks BNL1 may have a shape extended in the second direction DR2 within each of the sub-pixels PXn, and may not be extended to an adjacent sub-pixel PXn in the second direction DR2. For example, the length of the first bank BNL1 in the second direction DR2 may be larger than the length of the emission area EMA of each of the sub-pixels PXn so that it may not exceed the cut area CBA and other sub-pixels PXn in the second direction DR2. Accordingly, among the position of the second bank BNL2 extended in the first direction DR1, a portion disposed between the emission area EMA and the cut area CBA and a portion separating the sub-pixels PXn adjacent to each other in the second direction DR2 may be disposed on the first bank BNL1.

The first banks BNL1 may be spaced apart from each other in the first direction DR1. The first banks BNL1 may have a width in the first direction DR1 and may be disposed across the boundary of an adjacent sub-pixel PXn in the first direction DR1. The first banks BNL1 may include the emission area EMA of each of the sub-pixels PXn and may be disposed beyond the boundary therebetween. Accordingly, a portion of the portions of the second bank BNL2 extended in the second direction DR2 may be disposed on the first bank BNL1. Two first banks BNL1 may be partially disposed in a sub-pixel PXn such that they may be spaced apart from each other, and the light-emitting elements 30 may be disposed therebetween.

Although two first banks BNL1 may be disposed in a sub-pixel PXn, the disclosure is not limited thereto. More than two first banks BNL1 may be further disposed depending on the number of the alignment electrodes 21 and 22 to be described below. The shape of the first banks BNL1 is not limited thereto, and they may be disposed to occupy a smaller area in each of the sub-pixels PXn.

The first banks BNL1 may have a structure that at least partly protrudes from the upper surface of the first planarization layer 19. The protrusions of the first banks BNL1 may have inclined side surfaces. The light emitted from the light-emitting element 30 may be reflected by the alignment electrodes 21 and 22 disposed on the first banks BNL1 so that the light may exit toward the upper side of the first planarization layer 19. The first banks BNL1 may provide the area in which the light-emitting element 30 may be disposed and may also serve as reflective partition walls that reflect light emitted from the light-emitting element 30 upward. The side surfaces of the first banks BNL1 may be inclined in a linear shape, but the disclosure is not limited thereto. The first banks BNL1 may have a semicircle or semi-ellipse shape with a curved outer surface. The first banks BNL1 may include, but are not limited to, an organic insulating material such as polyimide (PI).

The alignment electrodes 21 and 22 may be disposed on the first banks BNL1 and the first planarization layer 19. The alignment electrodes 21 and 22 may include the first alignment electrode 21 and the second alignment electrode 22. The alignment electrodes 21 and 22 may be extended in the second direction DR2 and may be spaced apart from each other in the first direction DR1.

The first alignment electrode 21 and the second alignment electrode 22 may be extended in the second direction DR2 in each of the sub-pixels PXn, and they may be separated from other electrodes 21 and 22 in the cut area CBA, respectively. For example, the cut area CBA may be disposed between the emission areas EMA of the neighboring sub-pixels PXn in the second direction DR2, and the first alignment electrode 21 and the second alignment electrode 22 may be separated from other first alignment electrode 21 and second alignment electrode 22 disposed in an adjacent sub-pixel PXn in the second direction DR2 in the cut area CBA. It is, however, to be understood that the disclosure is not limited thereto. Some alignment electrodes 21 and 22 may not be separated for each of the sub-pixels PXn but may be extended and disposed across adjacent sub-pixels PXn in the second direction DR2. In other embodiments, only one of the first alignment electrode 21 and the second alignment electrode 22 may be separated.

The first alignment electrode 21 may be electrically connected to the first transistor T1 through a first contact hole CT1, and the second alignment electrode 22 may be electrically connected to the second voltage line VL2 through a second contact hole CT2. For example, an extended portion of the first alignment electrode 21 in the first direction DR1 of the second bank BNL2 may electrically contact the first conductive pattern CDP through the first contact hole CT1 penetrating through the first bank BNL1 and the first planarization layer 19. An extended portion of the second alignment electrode 22 in the first direction DR1 of the second bank BNL2 may electrically contact the second voltage line VL2 through the second contact hole CT2 penetrating through the first bank BNL1 and the first planarization layer 19. It is, however, to be understood that the disclosure is not limited thereto. According to another embodiment, the first contact hole CT1 and the second contact hole CT2 may be formed in the emission area EMA surrounded by the second bank BNL2 so that they do not overlap the second bank BNL2.

Although one first alignment electrode 21 and one second alignment electrode 22 may be disposed for each of the sub-pixels PXn in the drawings, the disclosure is not limited thereto. More than one first alignment electrodes 21 and more than one second alignment electrodes 22 may be disposed in each of the sub-pixels PXn. The first alignment electrode 21 and the second alignment electrode 22 disposed in each of the sub-pixels PXn may not necessarily have a shape extended in a direction but may have a variety of structures. For example, the first alignment electrode 21 and the second alignment electrode 22 may have a partially curved or bent shape, and an electrode may be disposed to surround another electrode.

The first alignment electrode 21 and the second alignment electrode 22 may be disposed on the first banks BNL1, respectively. The first alignment electrode 21 and the second alignment electrode 22 may have a smaller width than the first banks BNL1. For example, each of the first alignment electrode 21 and the second alignment electrode 22 may be disposed to cover only a portion of a side surface of the first banks BNL1. The first alignment electrode 21 and the second alignment electrode 22 may be respectively disposed on the side surfaces of the first banks BNL1, and the distance between the first alignment electrode 21 and the second alignment electrode 22 may be smaller than the distance between the first banks BNL1. At least a portion of the first alignment electrode 21 and the second alignment electrode 22 may be disposed directly on the first planarization layer 19 so that they may be located on a same plane. It is, however, to be understood that the disclosure is not limited thereto. In some implementations, the alignment electrodes 21 and 22 may have a larger width than that of the first banks BNL1.

Each of the alignment electrodes 21 and 22 may include a conductive material having a high reflectance. For example, each of the alignment electrodes 21 and 22 may include a metal such as at least one of silver (Ag), copper (Cu) and aluminum (Al) as the material having a high reflectance, and may be an alloy including aluminum (Al), nickel (Ni), lanthanum (La), etc., or a combination thereof. Each of the alignment electrodes 21 and 22 may reflect light that may be emitted from the light-emitting element 30 and travels toward the side surfaces of the first banks BNL1 toward the upper side of each of the sub-pixels PXn.

It is, however, to be understood that the disclosure is not limited thereto. Each of the alignment electrodes 21 and 22 may further include a transparent conductive material. For example, each of the alignment electrodes 21 and 22 may include a material such as indium tin oxide (ITO), indium zinc oxide (IZO), indium tin zinc oxide (ITZO), or a combination thereof. In some embodiments, each of the alignment electrodes 21 and 22 may have a structure in which one or more layers of a transparent conductive material and a metal layer having high reflectivity may be stacked, or may be made up of a single layer including them. For example, each of the alignment electrodes 21 and 22 may have a stack structure such as ITO/silver (Ag)/ITO/, ITO/Ag/IZO, or ITO/Ag/ITZO/IZO.

The alignment electrodes 21 and 22 may be electrically connected to the light-emitting elements 30, and a voltage may be applied so that the light-emitting elements 30 can emit light. The alignment electrodes 21 and 22 may be electrically connected to the light-emitting element 30 through the contact electrodes CNE1 and CNE2, and electrical signals applied thereto may be transferred to the light-emitting element 30 through the contact electrodes CNE1 and CNE2.

One of the first alignment electrode 21 and the second alignment electrode 22 may be electrically connected to an anode electrode of the light-emitting element 30, while another may be electrically connected to a cathode electrode of the light-emitting element 30. It is, however, to be understood that the disclosure is not limited thereto. That is to say, the first electrode 21 may be electrically connected to the cathode electrode while the second electrode 22 may be electrically connected to the anode electrode.

The alignment electrodes 21 and 22 may be utilized to form an electric field within the sub-pixel PXn to align the light-emitting elements 30. The light-emitting elements 30 may be arranged between the first alignment electrode 21 and the second alignment electrode 22 by the electric field formed across on the first alignment electrode 21 and the second alignment electrode 22. The light-emitting elements 30 of the display device 10 may be sprayed on the alignment electrodes 21 and 22 via an inkjet printing process. In case that the ink containing the light-emitting elements 30 is sprayed onto the alignment electrodes 21 and 22, an alignment signal may be applied to the alignment electrodes 21 and 22 to generate an electric field. The light-emitting elements 30 dispersed in the ink may be aligned on the alignment electrodes 21 and 22 by receiving a dielectrophoretic force due to the electric field generated over the alignment electrodes 21 and 22.

The first passivation layer PAS1 may be disposed on the first planarization layer 19. The first passivation layer PAS1 may be disposed to cover the first banks BNL1, the first electrodes 21 and the second electrodes 22. The first passivation layer PAS1 may be disposed to partially cover the wire pad WPD in the pad area PDA. The first passivation layer PAS1 can protect the first alignment electrode 21 and the second alignment electrode 22 and insulate them from each other. It can prevent that the light-emitting element 30 disposed on the first passivation layer PAS1 may be brought into contact with other elements and damaged.

The first passivation layer PAS1 may include a first opening OP1 exposing the first planarization layer 19 between the first alignment electrode 21 and the second alignment electrode 22. The first passivation layer PAS1 may cover an end of the first alignment electrode 21 and an end of the second alignment electrode 22. An end of the first alignment electrode 21 and an end of the second alignment electrode 22 may face each other and may be adjacent to the first opening OP1. The first opening OP1 may not overlap the first alignment electrode 21 and the second alignment electrode 22, and may be spaced apart from the end of the first alignment electrode 21 and the end of the second alignment electrode 22. The first opening OP1 may be extended in the second direction DR2 in the emission area EMA. The first opening OP1 may be disposed parallel to the first alignment electrode 21 and the second alignment electrode 22.

The first opening OP1 may have a width W1. The first opening OP1 may lead the light-emitting elements 30 to be correctly seated between the first alignment electrode 21 and the second alignment electrode 22. Accordingly, the width W1 of the first opening OP1 may be larger (e.g., longer) than the length of the light-emitting elements 30.

The first passivation layer PAS1 may include second openings OP2 partially exposing the first alignment electrode 21 and the second alignment electrode 22. The second openings OP2 may partially expose parts of the alignment electrodes 21 and 22 disposed on an upper surface of the first banks BNL1, respectively. Parts of the contact electrodes CNE1 and CNE2 may electrically contact the alignment electrodes 21 and 22 exposed through the second openings OP, respectively.

The second bank BNL2 may be disposed on the first passivation layer PAS1. The second bank BNL2 may be disposed in a lattice pattern on the entire surface of the display area DPA including portions extended in the first direction DR1 and the second direction DR2 when viewed from the top. The second bank BNL2 may be disposed along the border of each of the sub-pixels PXn to distinguish adjacent sub-pixels PXn from one another. The second bank BNL2 may be disposed to surround the outer periphery of the display area DPA and may not be disposed in the pad area PDA so that the wire pads WPD may be exposed.

The second bank BNL2 may be disposed to surround the emission area EMA and the cut area CBA disposed in each of the sub-pixels PXn to distinguish them. The first alignment electrode 21 and the second alignment electrode 22 may be extended in the second direction DR2 and may be disposed across a portion of the second bank BNL2 that may be extended in the first direction DR1. The portion of the second bank BNL2 extended in the second direction DR2 may have a larger width between the emission areas EMA than between the cut areas CBA. Accordingly, the distance between the cut areas CBA may be smaller than the distance between the emission areas EMA.

According to an embodiment of the disclosure, a portion of the second bank BNL2 may be disposed on the first bank BNL1 and may be formed to have a height greater than that of the first bank BNL1. The second bank BNL2 can prevent the ink in which different light-emitting elements 30 may be dispersed from overflowing to adjacent sub-pixels PXn during the inkjet printing process of the processes of fabricating the display device 10, so that different sub-pixels PXn can be separated from one another and the ink may not be mixed. The second bank BNL2 may include, but is not limited to, polyimide (PI), like the first banks BNL1.

The light-emitting elements 30 may be disposed on the first planarization layer 19. The light-emitting elements 30 may be spaced apart from one another in the second direction DR2 in which the alignment electrodes 21 and 22 may be extended, and may be aligned substantially parallel to one another. The light-emitting elements 30 may have a shape extended in a direction. The direction in which the alignment electrodes 21 and 22 may be extended may be substantially perpendicular to the direction in which the light-emitting elements 30 may be extended. It is, however, to be understood that the disclosure is not limited thereto. The light-emitting elements 30 may be oriented obliquely to the direction in which the alignment electrodes 21 and 22 may be extended, rather than being perpendicular to it.

The light-emitting elements 30 disposed in each of the sub-pixels PXn may include the emissive layer 36 (see FIG. 9) including different materials and may emit lights with different wavelength ranges to the outside. Accordingly, lights of the first color, the second color and the third color may be emitted from the first sub-pixel PX1, the second sub-pixel PX2 and the third sub-pixel PX3, respectively. It is, however, to be understood that the disclosure is not limited thereto. The sub-pixels PXn may include a same kind of light-emitting elements 30 and may emit light of substantially a same color.

The light-emitting elements 30 may be disposed in the first opening OP1 of the first passivation layer PAS1 and may be disposed on the first planarization layer 19. The light-emitting elements 30 may be disposed on a same layer as the first and second alignment electrodes 21 and 22 and spaced apart from each other. For example, the light-emitting elements 30, the first alignment electrode 21 and the second alignment electrode 22 may be disposed in contact with the upper surface of the first planarization layer 19. An end of each of the light-emitting elements 30 may face and may be spaced apart from an end of the first alignment electrode 21, and another end of each of the light-emitting elements 30 may face and may be spaced apart from another end of the second alignment electrode 22.

Multiple layers of the light-emitting elements 30 may be disposed in the direction perpendicular to the upper surface of the first substrate 11 or the first planarization layer 19. The light-emitting elements 30 may be arranged such that an extending direction may be parallel to the upper surface of the first planarization layer 19, and semiconductor layers included in the light-emitting elements 30 may be disposed sequentially in the direction parallel to the upper surface of the first planarization layer 19. It is, however, to be understood that the disclosure is not limited thereto. In case that the light-emitting elements 30 have a different structure, semiconductor layers may be arranged in a direction perpendicular to the upper surface of the first planarization layer 19.

The ends of each of the light-emitting elements 30 may electrically contact the contact electrodes CNE1 and CNE2, respectively. For example, an end of each of the light-emitting elements 30 may electrically contact with the first contact electrode CNE1, and another end of each of the light-emitting elements 30 may electrically contact the second contact electrode CNE2. According to an embodiment of the disclosure, an insulating film 38 (see FIG. 9) may not be formed at the extended end surface of each of the light-emitting elements 30, so that an electrode layer 37 (see FIG. 9) may be exposed. The exposed electrode layer may electrically contact the first contact electrode CNE1. The insulating layer may not be formed at another end surface of each of the light-emitting elements 30, so that the first semiconductor layer 31 (see FIG. 9) may be exposed. The exposed first semiconductor layer may electrically contact the second contact electrode CNE2.

The contact electrodes CNE1 and CNE2 may be disposed on the first passivation layer PAS1. The contact electrodes CNE1 and CNE2 may have a shape extended in a direction and may be disposed on the alignment electrodes 21 and 22. The contact electrodes CNE1 and CNE2 may include a first contact electrode CNE1 disposed on the first alignment electrode 21 and a second contact electrode CNE2 disposed on the second alignment electrode 22. The first contact electrode CNE1 and the second contact electrode CNE2 may be disposed to be spaced apart from or face each other. For example, the first contact electrode CNE1 and the second contact electrode CNE2 may be disposed on the first alignment electrode 21 and the second alignment electrode 22, respectively, and may be spaced apart from each other in the first direction DR1. The contact electrodes CNE1 and CNE2 may form a stripe pattern in the emission area EMA of each of the sub-pixels PXn.

Each of the contact electrodes CNE1 and CNE2 may electrically contact the light-emitting elements 30. The first contact electrode CNE1 may electrically contact an end of each of the light-emitting elements 30, and the second contact electrode CNE2 may electrically contact another end of each of the light-emitting elements 30. The first contact electrode CNE1 may electrically contact a first end of each of the light-emitting elements 30 and may be disposed to extend to the upper surface of each of the light-emitting elements 30. The second contact electrode CNE2 may also electrically contact a second end of each of the light-emitting elements 30 and may be disposed to extend to the upper surface of each of the light-emitting elements 30. The first contact electrode CNE1 may electrically contact the first alignment electrode 21 through a second opening OP2 exposing a portion of the upper surface of the first alignment electrode 21, and the second contact electrode CNE2 may electrically contact the second alignment electrode 22 through the second opening OP2 exposing a portion of the upper surface of the second alignment electrode 22.

The width of the contact electrodes CNE1 and CNE2 that may be measured in a direction may be larger than the width of the alignment electrodes 21 and 22 that may be measured in the direction. The contact electrodes CNE1 and CNE2 may electrically contact the ends and other ends of the light-emitting elements 30 and may cover a portion of the upper surface of each of the first alignment electrode 21 and the second alignment electrode 22. It is, however, to be understood that the disclosure is not limited thereto. The width of the contact electrodes CNE1 and CNE2 may be smaller than that of the alignment electrodes 21 and 22.

The contact electrodes CNE1 and CNE2 may include a transparent, conductive material. For example, the contact electrodes may include ITO, IZO, ITZO, aluminum (Al), etc., or a combination thereof. Light emitted from the light-emitting elements 30 may pass through the contact electrodes CNE1 and CNE2 and travel toward the alignment electrodes 21 and 22. It is, however, to be understood that the disclosure is not limited thereto.

Although the two contact electrodes CNE1 and CNE2 may be disposed in one sub-pixel PXn in the drawings, the disclosure is not limited thereto. The number of the contact electrodes CNE1 and CNE2 may vary depending on the number of alignment electrodes 21 and 22 disposed for each of the sub-pixels PXn.

The second passivation layer PAS2 may be disposed on the light-emitting elements 30. The second passivation layer PAS2 may be disposed to overlap the first opening OP1 and may be extended in the first direction DR1 parallel to the first alignment electrode 21. In an embodiment, the second passivation layer PAS2 may overlap the first contact electrode CNE1 and the second contact electrode CNE2, but may not overlap the first alignment electrode 21 and the second alignment electrode 22. The second passivation layer PAS2 may be disposed on the first contact electrode CNE1 and the second contact electrode CNE2 while surrounding the light-emitting elements 30.

The second passivation layer PAS2 may cover at least upper surfaces of the light-emitting elements 30 exposed between the first and second contact electrodes CNE1 and CNE2. According to an embodiment of the disclosure, the second passivation layer PAS2 may be formed in an isolated (e.g., island) pattern extended in the first direction DR1. The second passivation layer PAS2 may have a width W2 extended in the second direction DR2. The width W2 of the second passivation layer PAS2 may be smaller than the width W1 of the first opening OP1 in the second direction DR2 and may be larger than the length of the light-emitting elements 30. According to another embodiment shown in FIG. 7, the width of the second passivation layer PAS2 may be smaller than the width of the first opening OP1 and the length of the light-emitting elements 30. In such case, the second passivation layer PAS2 may not overlap the first contact electrode CNE1 and the second contact electrode CNE2.

During the process of fabricating the display device 10, the second passivation layer PAS2 may be disposed to cover the light-emitting elements 30 and the contact electrodes 21 and 22 and may be patterned to be disposed on the light-emitting elements 30. The second passivation layer PAS2 may be extended in the second direction DR2 on the first passivation layer PAS1 when viewed from the top, thereby forming an isolated (e.g., a linear or island-like) pattern in each of the sub-pixels PXn.

According to another embodiment shown in FIG. 8, the second passivation layer PAS2 may be disposed entirely on the substrate 11. For example, the second passivation layer PAS2 may cover all of the second bank BNL2, the first passivation layer PAS1, the first contact electrode CNE1, the light-emitting element 30, and the second contact electrode CNE2.

The second passivation layer PAS2 can protect the light-emitting elements 30 and fix the light-emitting element 30 during the process of fabricating the display device 10. According to an embodiment of the disclosure, the second passivation layer PAS2 may cover at least an upper surface of the light-emitting element 30 exposed between the first and second contact electrodes CNE1 and CNE2, so that the light-emitting element 30 can be fixed effectively. The second passivation layer PAS2 may be extended to the upper surfaces of the first and second contact electrodes CNE1 and CNE2 to cover them, so that the first contact electrode CNE1 and the second contact electrode CNE2 can be fixed as well as the light-emitting element 30. Accordingly, an adhesive force between the light-emitting element 30 and the first contact electrode CNE1 and an adhesive force between the light-emitting element 30 and the second contact electrode CNE2 can be further increased.

Each of the first passivation layer PAS1 and the second passivation layer PAS2 may include an inorganic insulating material or an organic insulating material. For example, the first insulating layer PAS1 and the second insulating layer PAS2 may include an inorganic insulating material such as silicon oxide (SiOx), silicon nitride (SiNx), silicon oxynitride (SiOxNy), aluminum oxide ($Al_2O_3$), aluminum nitride (AlN), or a combination thereof. In other embodiments, they may include, as an organic insulating material, an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, etc., or a combination thereof. It is, however, to be understood that the disclosure is not limited thereto.

The display element layer disposed in the display area DPA may include the first alignment electrode 21, the second alignment electrode 22, the light-emitting element 30, the first contact electrode CNE1 and the second contact electrode CNE2, so that light in a certain wavelength range can be emitted. External devices EXD that transmit driving signals for driving the sub-pixels PXn may be mounted in the pad area PDA. The external devices EXD may be connected to the wire pads WPD of the pad area PDA. The wire pads WPD may be electrically connected to the external devices EXD through the pad electrodes PAD_R and PAD_C disposed thereon.

Hereinafter, the wire pads WPD and the pad electrodes PAD_R and PAD_C disposed in the pad area PDA will be described.

The wire pads WPD may be disposed on the second interlayer dielectric layer 17 in the pad area PDA. The wire pads WPD may be disposed on a same layer as the second data conductive layer. The pad electrodes PAD_R and PAD_C may be disposed on the wire pads WPD. According to an embodiment of the disclosure, the pad electrodes PAD_R and PAD_C may include a pad electrode base layer PAD_R disposed on the wire pad WPD and a pad electrode capping layer PAD_C disposed thereon.

According to an embodiment, the pad electrode base layer PAD_R may be formed via a same process as the alignment electrodes 21 and 22 of the display area DPA, and may include a same material. The wire pads WPD may be disposed on a same layer as the second data conductive layer and may include a same material as them, e.g., a metal material such as copper (Cu). The pad electrode base layer PAD_R may electrically connect the external device EXD with the wire pad WPD along with the pad electrode capping layer PAD_C, and may cap the wire pad WPD to thereby prevent the wire pad WPD from being damaged during a subsequent process.

The first passivation layer PAS1 may also be disposed in the pad area PDA. The first passivation layer PAS1 may be disposed on the pad electrode base layer PAD_R to cover the PAD_R, and may include a pad opening OP_P exposing a portion of the upper surface of the pad electrode base layer PAD_R.

The pad electrode capping layer PAD_C may be disposed on the first passivation layer PAS1. The pad electrode capping layer PAD_C may be disposed to cover the pad opening OP_P of the first passivation layer PAS1, and may be in direct contact with a portion of the upper surface of the pad electrode base layer PAD_R exposed by the pad opening OP_P. The pad electrode capping layer PAD_C may form a pad electrode of the wire pad WPD together with the pad electrode base layer PAD_R, and may electrically connect the external device EXD with the wire pad WPD. The external device EXD may be connected to the pad electrode capping layer PAD_C through a conductive material such as a conductive ball. According to an embodiment, the pad electrode capping layer PAD_C may be formed via a same process as the contact electrodes CNE1 and CNE2 of the display area DPA, and may include a same material.

Figure 9:
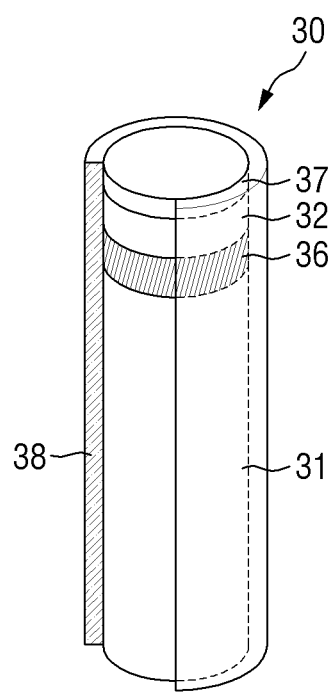
FIG. 9 is a schematic view showing a light-emitting element according to an embodiment of the disclosure.

FIG. 9 is a schematic view showing a light-emitting element according to an embodiment of the disclosure.

Referring to FIG. 9, the light-emitting element 30 may be a particulate element, and may have a rod-like or cylindrical shape having an aspect ratio. The light-emitting element 30 may have a size of a nanometer scale (from about 1 nm to about 1 μm) to a micrometer scale (from about 1 μm to about 1 mm). According to an embodiment of the disclosure, both the diameter and length of the light-emitting element 30 may have nanometer scales or micrometer scales. In some other embodiments, the diameter of the light-emitting element 30 may have a nanometer scale, while the length of the light-emitting element 30 may have a micrometer scale. In some embodiments, the diameter and/or length of some of the light-emitting elements 30 may have nanometer scales, while the diameter and/or length of others of the light-emitting elements 30 have micrometer scales.

According to an embodiment of the disclosure, the light-emitting element 30 may be an inorganic light-emitting diode. Specifically, the light-emitting element 30 may include a semiconductor layer doped with impurities of a conductive type (e.g., p-type or n-type). The semiconductor layer may receive an electric signal applied from an external power source and may emit light of a certain wavelength range.

According to an embodiment of the disclosure, the light-emitting element 30 may include a first semiconductor layer 31, an emissive layer 36, a second semiconductor layer 32, and an electrode layer 37 sequentially stacked on one another in the longitudinal direction. The light-emitting element may further include a first semiconductor layer 31, a second semiconductor layer 32, and an insulating film 38 surrounding an outer surface of the emissive layer 36.

The first semiconductor layer 31 may be an n-type semiconductor. In case that the light-emitting element 30 emits light of a blue wavelength band, the first semiconductor layer 31 may include a semiconductor material having a composition ratio below: $Al_xGa_yIn_{1-x-y}N$ ($0 \leq x \leq 1$, $0 \leq y \leq 1$, $0 \leq x+y \leq 1$). For example, the semiconductor material may be at least one of n-type doped AlGaInN, GaN, AlGaN, InGaN, AlN and InN. The first semiconductor layer 31 may be doped with an n-type dopant, and the n-type dopant may be Si, Ge, Sn, etc., or a combination thereof. For example, the first semiconductor layer 31 may be n-GaN doped with n-type Si. The length of the first semiconductor layer 31 may range, but is not limited to, from about 1.5 μm to about 5 μm.

The second semiconductor layer 32 may be disposed on the emissive layer 36 to be described later. The second semiconductor layer 32 may be a p-type semiconductor. In case that the light-emitting element 30 emits light of a blue or green wavelength band, the second semiconductor layer 32 may include a semiconductor material having a composition ratio below: $Al_xGa_yIn_{1-x-y}N$ ($0 \leq x \leq 2$, $0 \leq y \leq 1$, $0 \leq x+y \leq 1$). For example, it may be at least one of p-type doped AlGaInN, GaN, AlGaN, InGaN, AlN and InN. The second semiconductor layer 32 may be doped with a p-type dopant, and the p-type dopant may be Mg, Zn, Ca, Se, Ba, etc., or a combination thereof. For example, the second semiconductor layer 32 may be p-GaN doped with p-type Mg. The length of the second semiconductor layer 32 may range, but is not limited to, from about 0.05 µm to about 0.10 µm.

Although each of the first semiconductor layer 31 and the second semiconductor layer 32 may be implemented as a signal layer in the drawings, the disclosure is not limited thereto. Depending on the material of the emissive layer 36, the first semiconductor layer 31 and the second semiconductor layer 32 may further include a larger number of layers, e.g., a clad layer or a tensile strain barrier reducing (TSBR) layer.

The emissive layer 36 may be disposed between the first semiconductor layer 31 and the second semiconductor layer 32. The emissive layer 36 may include a material having a single or multiple quantum well structure. In case that the emissive layer 36 includes a material having the multiple quantum well structure, the structure may include quantum layers and well layers alternately stacked on one another. The emissive layer 36 may emit light as electron-hole pairs may be combined therein in response to an electrical signal applied through the first semiconductor layer 31 and the second semiconductor layer 32. In case that the emissive layer 36 emits light of the blue wavelength band, it may include a material such as AlGaN and AlGaInN. In particular, in case that the emissive layer 36 has a multi-quantum well structure in which quantum layers and well layers may be alternately stacked on one another, the quantum layers may include AlGaN or AlGaInN, and the well layers may include a material such as GaN and AlGaN. For example, the emissive layer 36 may include AlGaInN as the quantum layer and AlInN as the well layer, and, as described above, the emissive layer 36 may emit blue light having a center wavelength band of about 450 nm to about 495 nm.

It is, however, to be understood that the disclosure is not limited thereto. The emissive layer 36 may have a structure in which a semiconductor material having a large band gap energy and a semiconductor material having a small band gap energy may be alternately stacked on one another, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations. The length of the emissive layer 36 may be, but is not limited to, in the range of about 0.05 µm to about 0.10 µm.

The light emitted from the emissive layer 36 may exit not only through the outer surfaces of the light-emitting element 30 in the longitudinal direction but also through side surfaces. The direction in which the light emitted from the emissive layer 36 propagates is not limited to one direction.

The electrode layer 37 may be an ohmic contact electrode. It is, however, to be understood that the disclosure is not limited thereto. The element electrode layer may be Schottky contact electrodes. The light-emitting element 30 may include at least one electrode layer 37. Although the light-emitting element 30 includes one electrode layer 37 in the example shown in FIG. 8, the disclosure is not limited thereto. In some implementations, the light-emitting element 30 may include a larger number of electrode layers 37 or the electrode layer may be omitted. The following description on the light-emitting element 30 may be equally applied even if the number of electrode layers 37 may be different or it may further include other structures.

The electrode layer 37 can reduce the resistance between the light-emitting element 30 and the electrodes or the contact electrodes in case that the light-emitting element 30 is electrically connected to the electrodes or the contact electrodes in the display device 10 according to the embodiment of the disclosure. The electrode layer 37 may include a metal having conductivity. For example, the electrode layer 37 may include at least one of aluminum (Al), titanium (Ti), indium (In), gold (Au), silver (Ag), ITO, IZO and ITZO. The electrode layer 37 may include a semiconductor material doped with n-type or p-type impurities. The electrode layer 37 may include a same material or may include different materials. It is, however, to be understood that the disclosure is not limited thereto.

The insulating film 38 may be disposed to surround the outer surfaces of the semiconductor layers and electrode layers described above. For example, the insulating film 38 may be disposed to surround at least the outer surface of the emissive layer 36, and may be extended in a direction in which the light-emitting element 30 may be extended. The insulating film 38 may serve to protect the above-described elements. The insulating film 38 may be formed to surround the side surfaces of the elements, and both ends of the light-emitting element 30 in the longitudinal direction may be exposed.

Although the insulating film 38 may be extended in the longitudinal direction of the light-emitting element 30 to cover from the first semiconductor layer 31 to the side surface of the electrode layer 37 in the example shown in the drawing, the disclosure is not limited thereto. The insulating film 38 may cover only the outer surface of a portion of the semiconductor layer, including the light-emitting layer 36, or may cover only a part a portion of the outer surface of the electrode layer 37 to partially expose the outer surface of the electrode layer 37. A portion of the upper surface of the insulating film 38 may be rounded which may be adjacent to at least one end of the light-emitting element 30 in cross section.

The thickness of the insulating film 38 may be, but is not limited to, in the range of about 10 nm to about 1.0 µm. For example, the thickness of the insulating film 38 may be approximately 40 nm.

The insulating film 38 may include one or more materials having insulating properties such as silicon oxide (SiOx), silicon nitride (SiNx), silicon oxynitride (SiOxNy), aluminum nitride (AlN) and aluminum oxide ($Al_2O_3$). Although the insulating film 38 may be formed as a single layer in the drawings, the disclosure is not limited thereto. In some embodiments, the insulating film 38 may be formed as a multilayer structure in which multiple layers may be stacked on one another. Accordingly, it may be possible to prevent an electrical short-circuit that may occur in case that the emissive layer 36 comes in contact with an electrode through which an electric signal may be transmitted to the light-emitting element 30. Since the insulating film 38 may include the emissive layer 36 to protect the outer surface of the light-emitting element 30, it may be possible to prevent a decrease in luminous efficiency.

The outer surface of the insulating film 38 may be subjected to surface treatment. The light-emitting elements 30 may be dispersed in an ink, and the ink may be sprayed onto the electrode. In doing so, a surface treatment may be applied to the insulating film 38 so that it becomes hydrophobic or hydrophilic in order to keep the light-emitting elements 30 dispersed in the ink from being aggregated with one another. For example, the outer surface of the insulating film 38 may be subjected to surface treatment with a material such as stearic acid and 2,3-naphthalene dicarboxylic acid.

Hereinafter, processing steps of fabricating the display device 10 will be described with reference to other drawings.

The method of fabricating the display device 10 according to an embodiment may include preparing a substrate 11 including a first planarization layer 19 and forming a first alignment electrode 21 and a second alignment electrode 22 on the substrate 11. The method may include forming a first passivation layer PAS1 on the substrate 11, and removing the first passivation layer PAS1 between the first alignment electrode 21 and the second alignment electrode 22 to form a first opening OP1 for exposing the first planarization layer 19. The method may include aligning the light-emitting element 30 in the first opening OP1, forming a first contact electrode CNE1 that electrically connects a first end of the light-emitting element 30 and a second contact electrode CNE2 that electrically contacts a second end of the light-emitting element 30 on the first passivation layer PAS1, and forming a second passivation layer PAS2 on the light-emitting element 30.

Hereinafter, processes of fabricating the display device 10 will be described in detail with reference to other drawings. The structures of elements and methods of forming the structures of elements will be briefly described, and an order of the fabricating process will be described in detail.

FIGS. 10 to 19 are schematic cross-sectional views showing processing steps of a method of fabricating a display device according to an embodiment of the disclosure.

Figure 10:
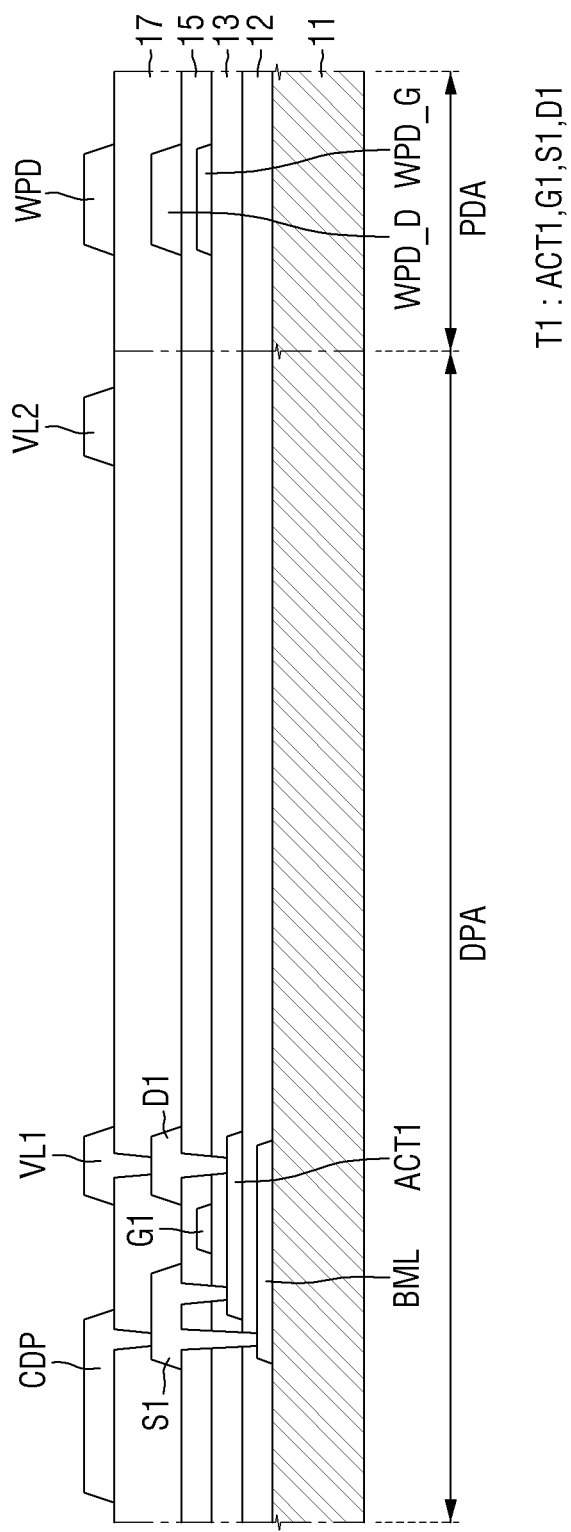
FIGS. 10 to 19 are schematic cross-sectional views showing processing steps of a method of fabricating a display device according to an embodiment of the disclosure.

Referring to FIG. 10, a substrate 11 may be prepared, where a first transistor T1, voltage lines VL1 and VL2, a first conductive pattern CDP, a gate pad WPD_G, a data pad WPD_D and a wire pad WPD may be disposed in the pad area PDA.

Figure 11:
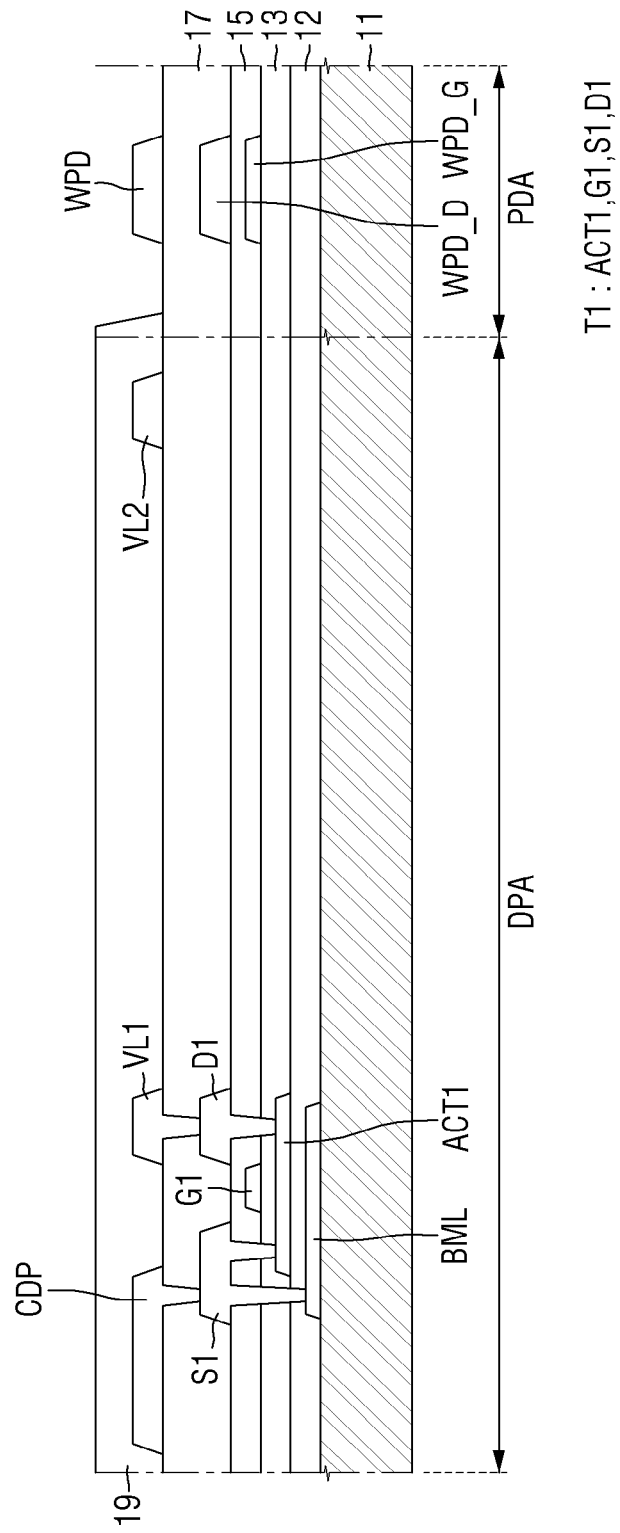
Figure 12:
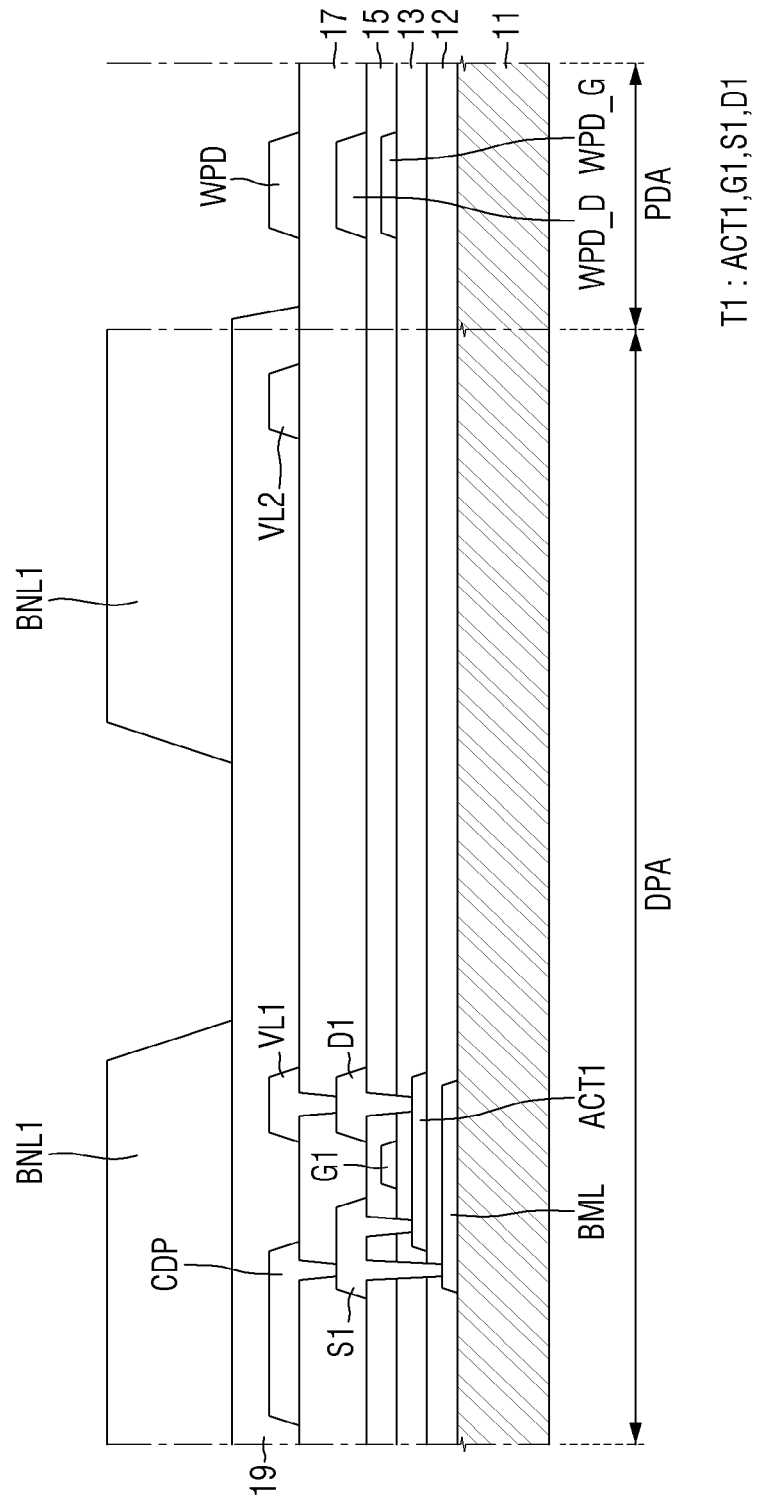

Subsequently, referring to FIGS. 11 and 12, a first planarization layer 19 may be formed on a second interlayer dielectric layer 17 in which a second data conductive layer may be formed, and first banks BNL1 may be formed on the first planarization layer 19. The first planarization layer 19 and the first banks BNL1 may include an organic material including a photosensitive material, and the first planarization layer 19 and the first banks BNL1 may be formed through exposure and development after applying the organic material layer. Although the first planarization layer 19 and the first banks BNL1 may be separated from each other and formed via different processes in the drawings, the disclosure is not limited thereto. The first planarization layer 19 and the first banks BNL1 may include a same material and may be integrated in one process. In such case, the first planarization layer 19 and the first banks BNL1 having different heights may be formed using a halftone mask or a slit mask.

The first planarization layer 19 and the first banks BNL1 may be disposed so that the wire pad WPD of the pad area PDA may be exposed. The first planarization layer 19 and the first banks BNL1 substantially may not be disposed in the pad area PDA. This may be because the organic material layer forming the first planarization layer 19 and the first banks BNL1 was formed also in the pad area PDA, and the portion thereof disposed in the pad area PDA may be completely removed during the process of partially removing the organic material layer.

Figure 13:
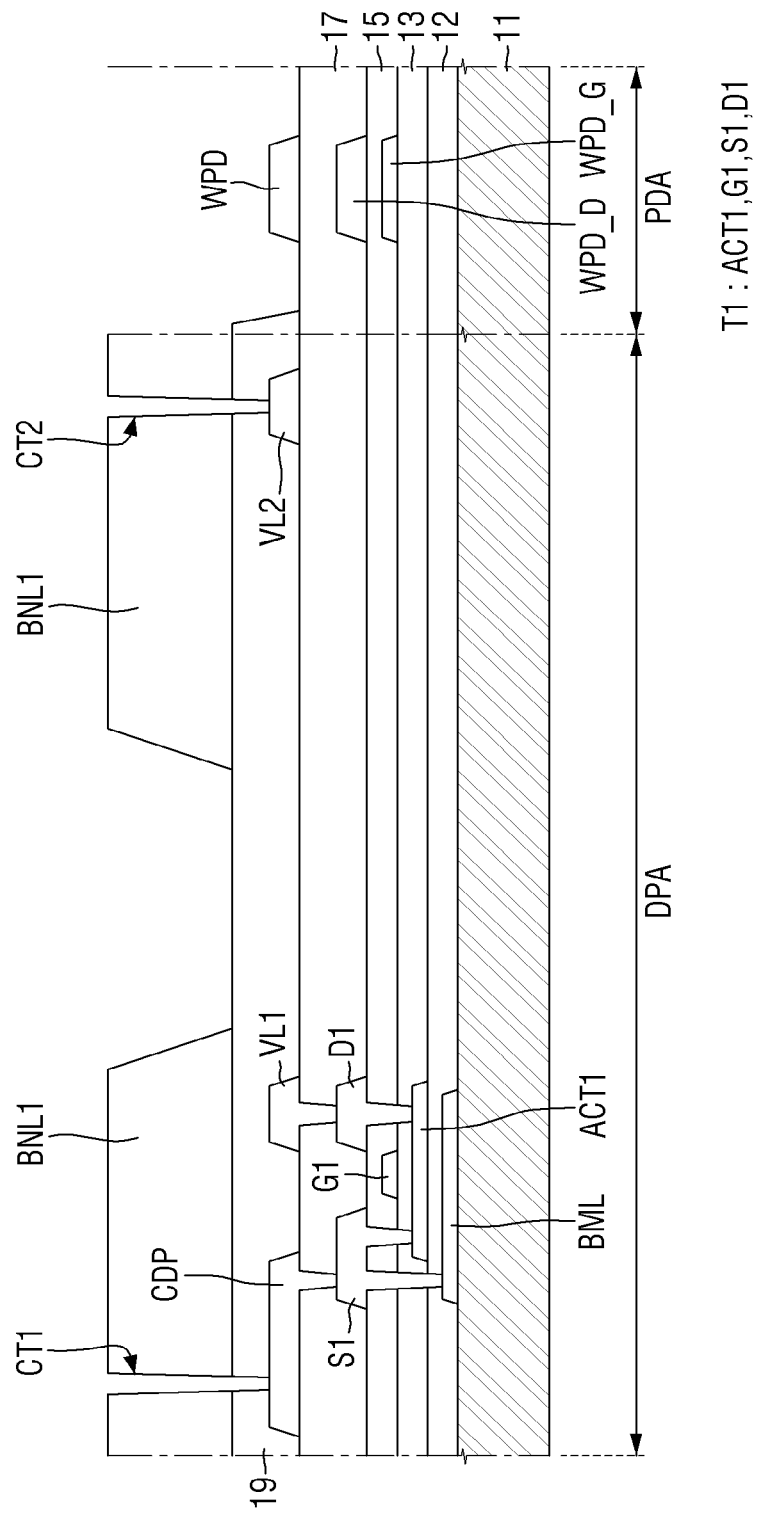
Figure 14:
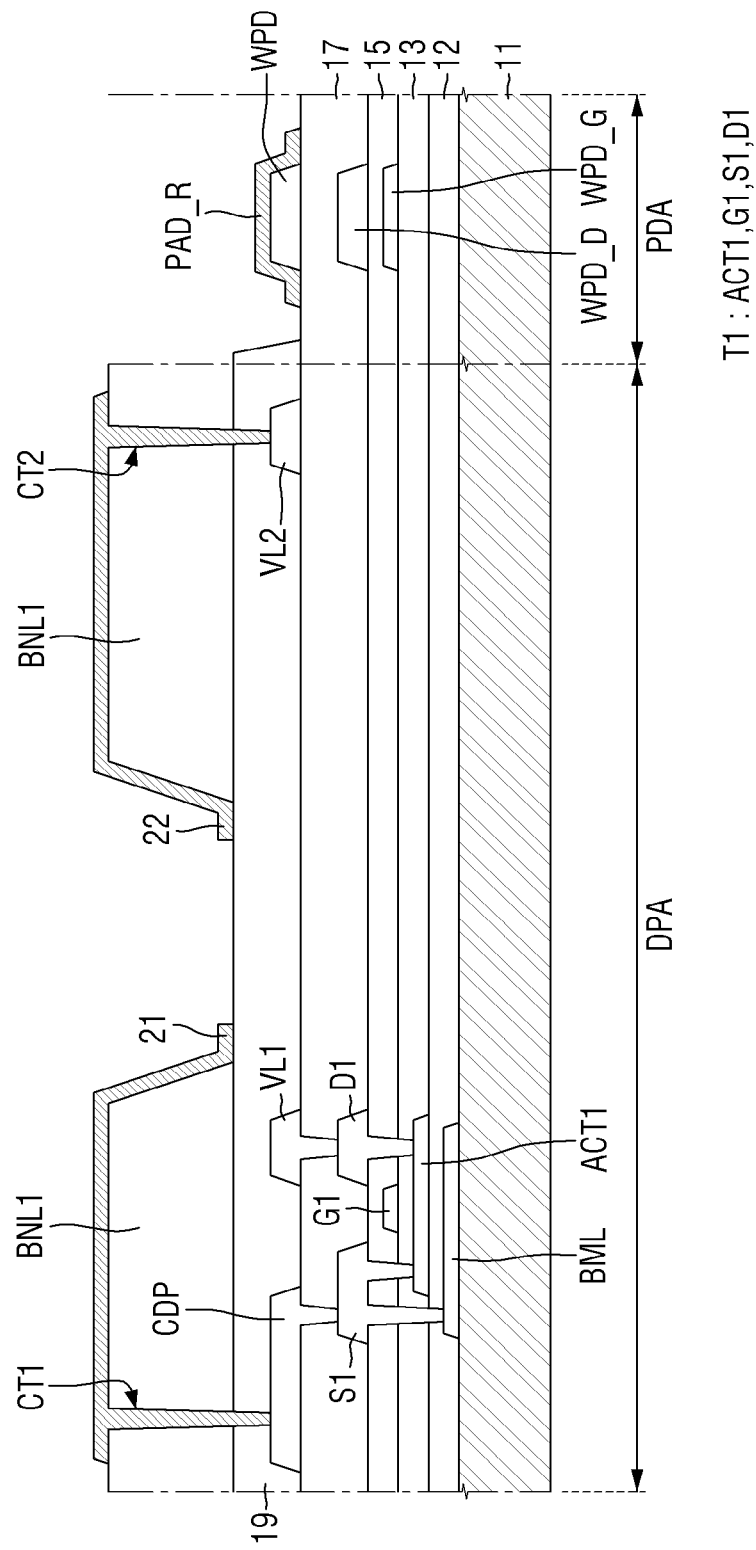

Subsequently, referring to FIGS. 13 and 14, contact holes CT1 and CT2 may be formed through the first planarization layer 19 and the first banks BNL1 to expose a portion of the second data conductive layer, and alignment electrodes 21 and 22 and a pad electrode base layer PAD_R may be formed thereon.

The alignment electrodes 21 and 22 and the pad electrode base layer PAD_R may be formed via a mask process. The alignment electrodes 21 and 22 and the pad electrode base layer PAD_R may be formed by depositing an electrode material layer entirely on the first planarization layer 19, the first banks BNL1 and the pad area PDA in which the second data conductive layer may be formed, and patterning the alignment electrodes 21 and 22 and the pad electrode base layer PAD_R. The electrode material layer may be deposited into the first contact hole CT1 and the second contact hole CT2, and the first alignment electrode 21 and the second alignment electrode 22 each may be connected to the second data conductive layer.

During a process of patterning the electrode material layer, the first electrode 21 and the second electrode 22 may be formed so that they may be extended and spaced apart from each other in a direction. The pad electrode base layer PAD_R may be formed to have a larger width than the wire pad WPD and may be disposed to cover the wire pad WPD. The alignment electrodes 21 and 22 of the display area DPA and the pad electrode base layer PAD_R of the pad area PDA may be formed via a same process and may include a same material. In the display device 10, a mask process for forming the pad area PDA may be omitted by simultaneously forming the pad electrode base layer PAD_R of the pad area PDA in the process of forming the display element layer in the display area DPA.

Figure 15:
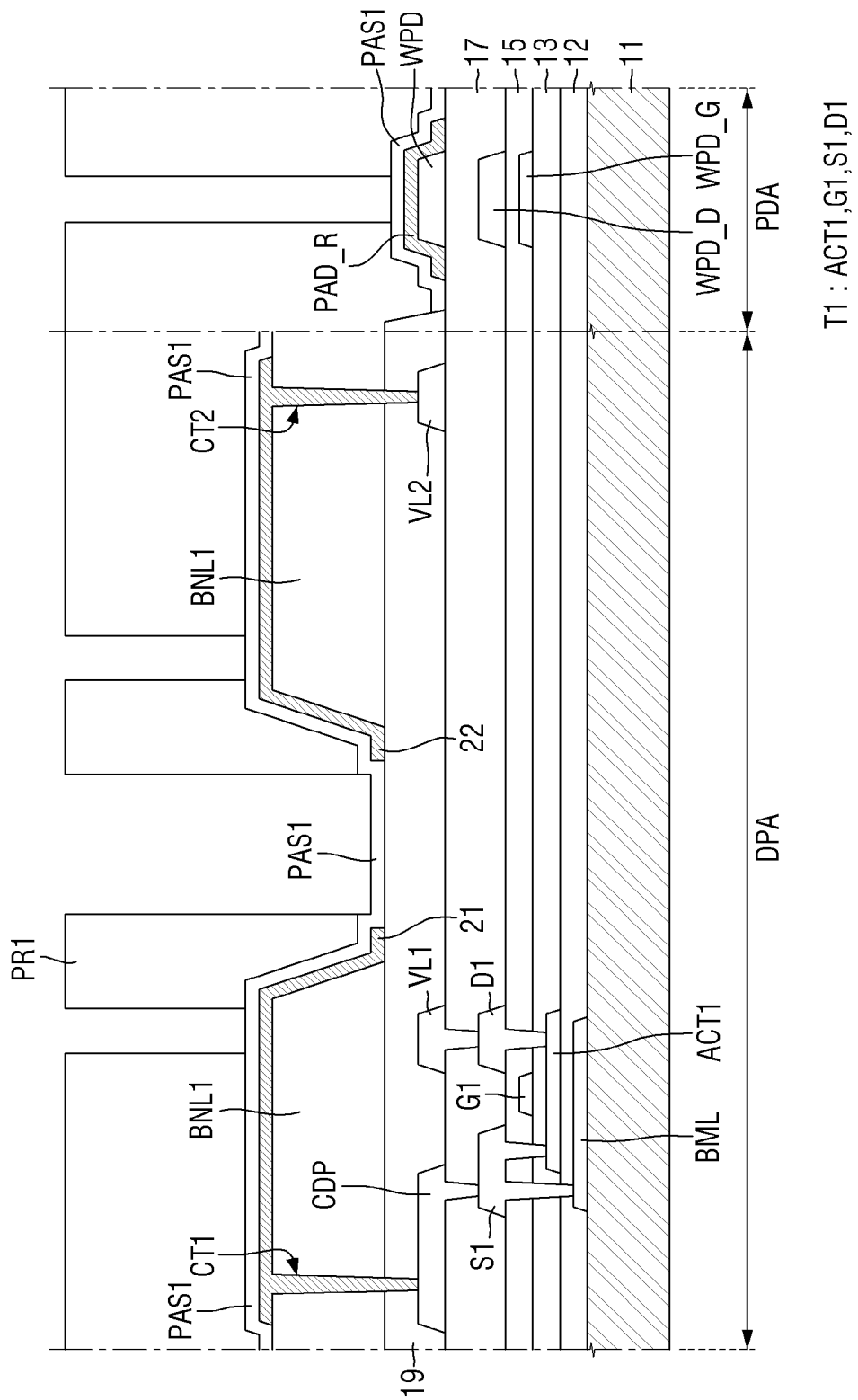

Subsequently, referring to FIG. 15, a first passivation layer PAS1 may be formed on the alignment electrodes 21 and 22 and the pad electrode base layer PAD_R, and a first photoresist pattern PR1 may be formed on the first passivation layer PAS1. The first passivation layer PAS1 may be formed by depositing an insulating material layer entirely on the display area DPA and the pad area PDA. The first passivation layer PAS1 may be formed to cover the pad electrode base layer PAD_R of the pad area PDA. The first photoresist pattern PR1 may not be formed at locations where first openings, second openings and pad openings of the first passivation layer PAS1 are to be formed. Subsequently, a portion of the first passivation layer PAS1 may be removed by etching using the first photoresist pattern PR1, and the first photoresist pattern PR1 may be removed by stripping.

Figure 16:
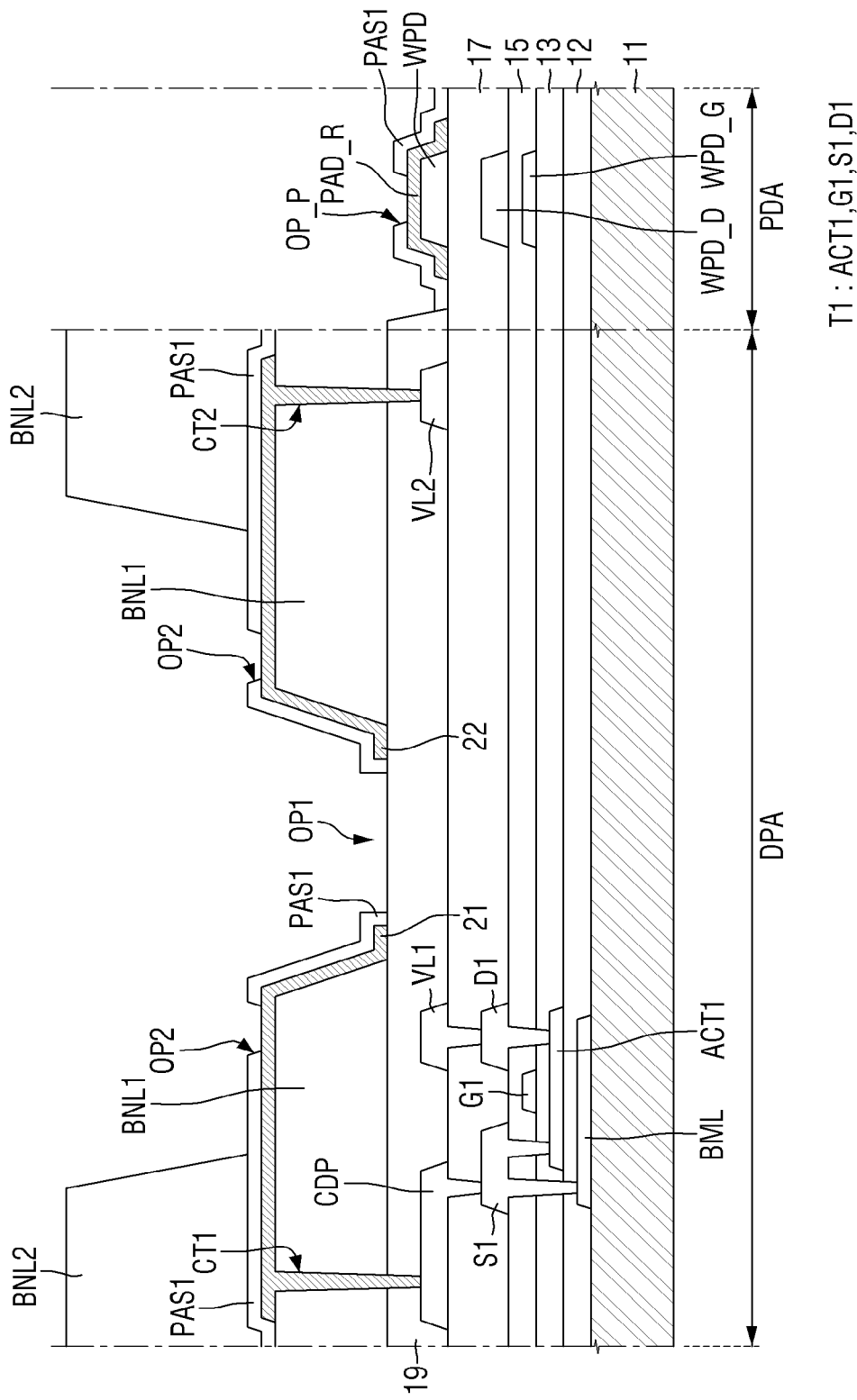

Subsequently, referring to FIG. 16, second openings OP2 exposing the first alignment electrode 21 and the second alignment electrode 22, respectively, may be formed in the first passivation layer PAS1, and a first opening OP1 exposing the first planarization layer 19 may be formed between the first alignment electrode 21 and the second alignment electrode 22. A pad opening OP_P may be formed in the pad area PDA to expose the pad electrode base layer PAD_R. Although not shown in FIG. 16, the first passivation layer PAS1 covering the first alignment electrode 21 and the second alignment electrode 22 on the cut area CBA may also be removed, so that the first alignment electrode 21 and the second alignment electrode 22 may be exposed.

Subsequently, a second bank BNL2 may be formed on the first insulating layer PAS1 in the display area DPA. The second bank BNL2 may be disposed on the first passivation layer PAS1 and may be formed via a same process as the first banks BNL1. A portion of the second bank BNL2 may be disposed on the first banks BNL1 and may be formed higher than the first banks BNL1. Although not shown in FIG. 16, the second bank BNL2 covering the cut area CBA may also be removed to expose the first and second alignment electrodes 21 and 22.

Figure 17:
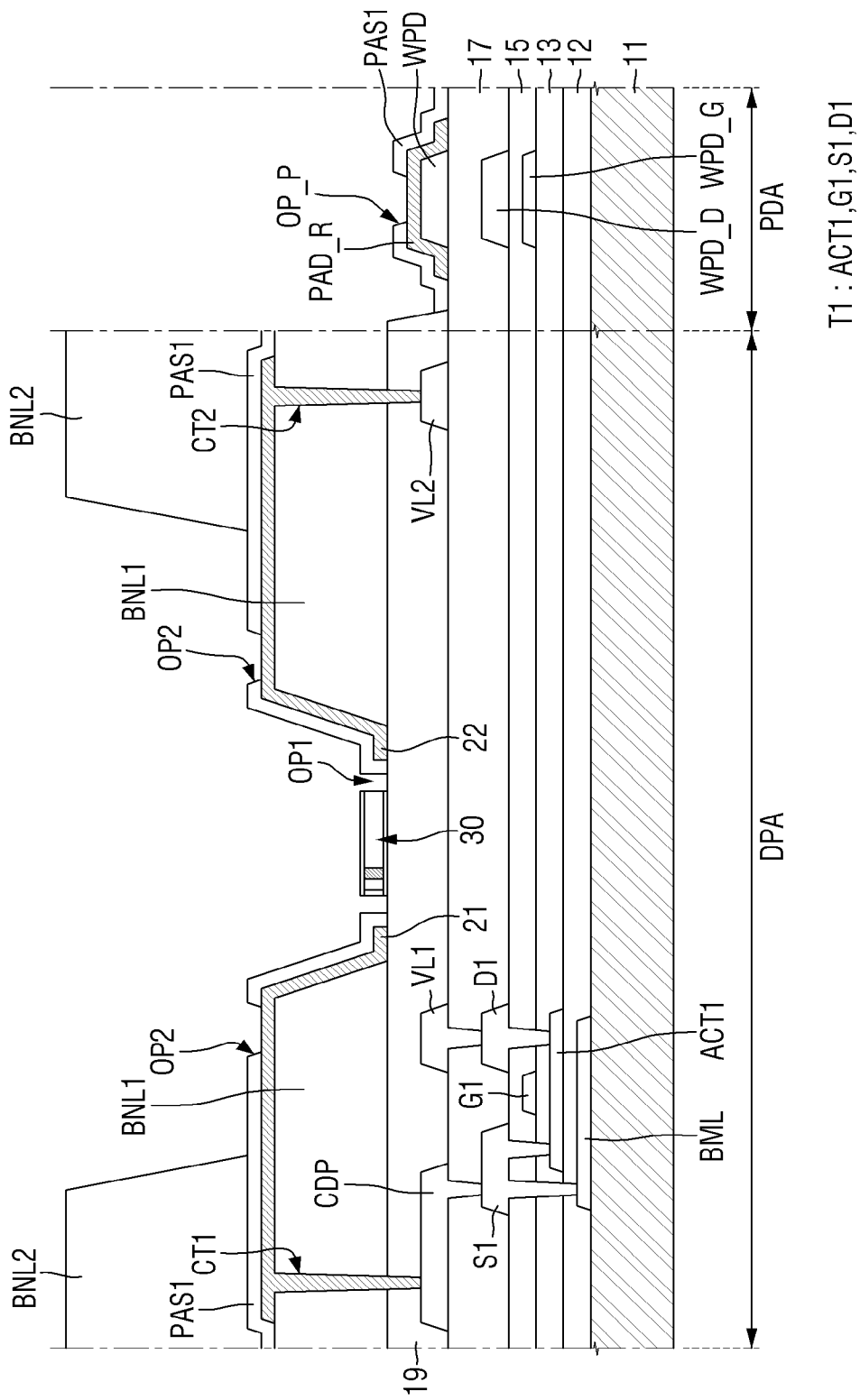

Subsequently, referring to FIG. 17, the light-emitting element 30 may be disposed on the first passivation layer PAS1 in the display area DPA. According to an embodiment, the light-emitting elements 30 disposed in an ink may be disposed on the alignment electrodes 21 and 22 via an inkjet printing process in which the ink may be ejected. The ink ejected from an inkjet printing apparatus may be settled in the area surrounded by the second bank BNL2. The second bank BNL2 can prevent the ink from overflowing to other neighboring sub-pixels PXn.

When the ink containing the light-emitting elements 30 is ejected, an electrical signal may be applied to each of the electrode layers 21 and 22 so that light-emitting elements 30 may be disposed on the first planarization layer 19 in the first opening OP1 of the first passivation layer PAS1. In case that the electric signal is applied to the alignment electrodes 21 and 22, an electric field may be generated over the alignment electrodes 21 and 22. The light-emitting elements 30 dispersed in the ink may be subjected to a dielectrophoresis force by the electric field, and thus the light-emitting elements 30 subjected to the dielectrophoresis force may be seated on the first planarization layer 19 while the orientations and positions may be changed. The length h of each of the light-emitting elements 30 may be made smaller than the width of the first opening OP1 and thus may be seated on the first planarization layer 19 in the first opening OP1.

Figure 18:
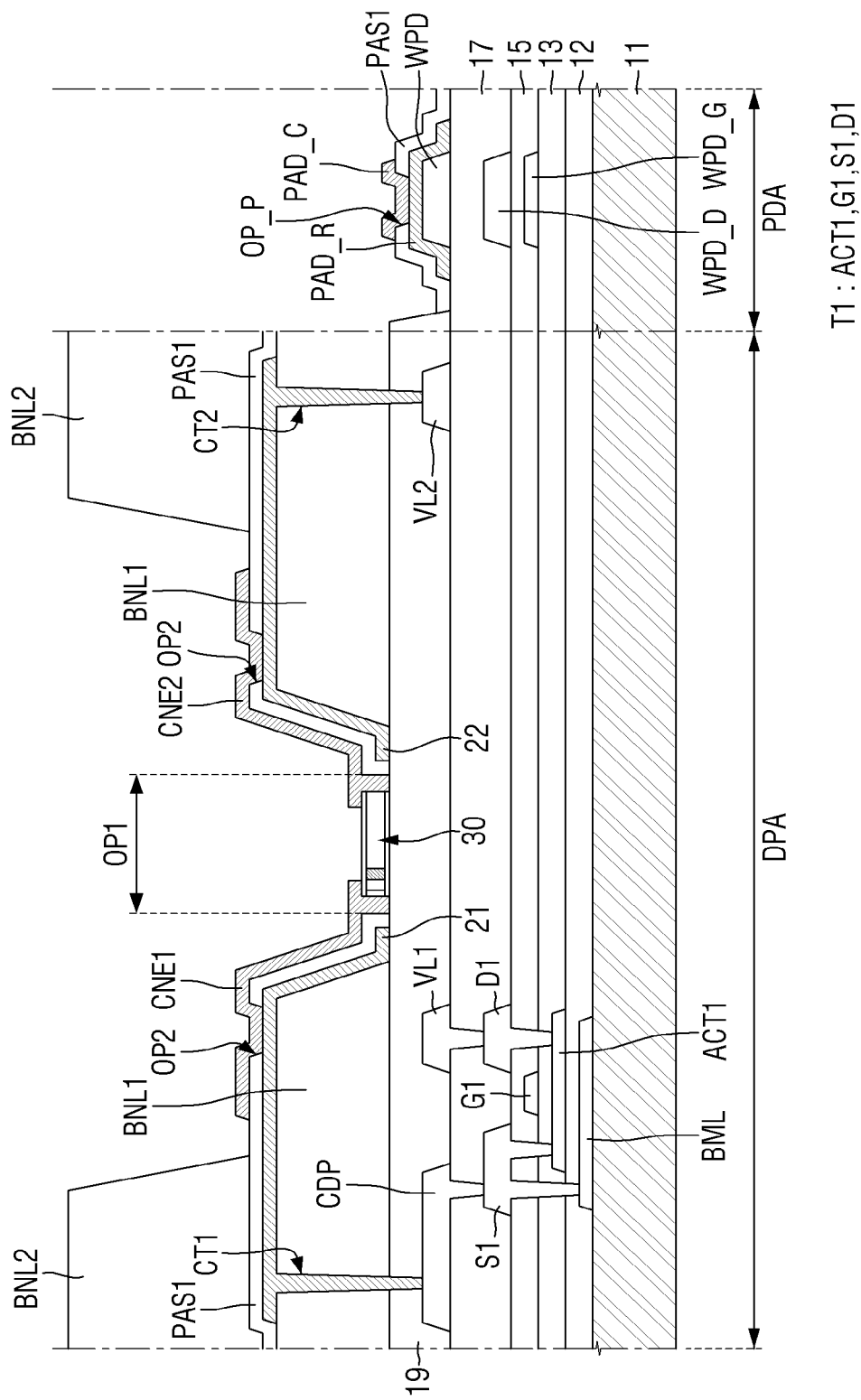

Subsequently, referring to FIG. 18, contact electrodes CNE1 and CNE2 may be formed on the first passivation layer PAS1, and the pad electrode capping layer PAD_C may be formed on the pad electrode base layer PAD_R. The contact electrodes CNE1 and CNE2 and the pad electrode base layer PAD_R may be formed by depositing a contact electrode material layer entirely on the first passivation layer PAS1, the first planarization layer 19 and the light-emitting element 30, and patterning it. The contact electrode material layer may be deposited into the openings OP1, OP2 and OP_P of the first passivation layer PAS1, and the contact electrodes CNE1 and CNE2 may be connected to the alignment electrodes 21 and 22, respectively, while the pad electrode capping layer PAD_C may be connected to the pad electrode base layer PAD_R. The first contact electrode CNE1 may electrically contact an end of the light-emitting element 30 within the first opening OP1, while the second contact electrode CNE2 may electrically contact another end of the light-emitting element 30 within the first opening OP1.

The contact electrodes CNE1 and CNE2 of the display area DPA and the pad electrode capping layer PAD_C of the pad area PDA may be formed via a same process and may include a same material. In the display device 10, a mask process for forming the pad area PDA may be omitted by simultaneously forming the pad electrode capping layer PAD_C of the pad area PDA in the process of forming the display element layer in the display area DPA. Although not shown in FIG. 18, the connection between the first alignment electrode 21 and the second alignment electrode 22 exposed in the cut area CBA may be disconnected during the process of patterning the contact electrodes CNE1 and CNE2.

Figure 19:
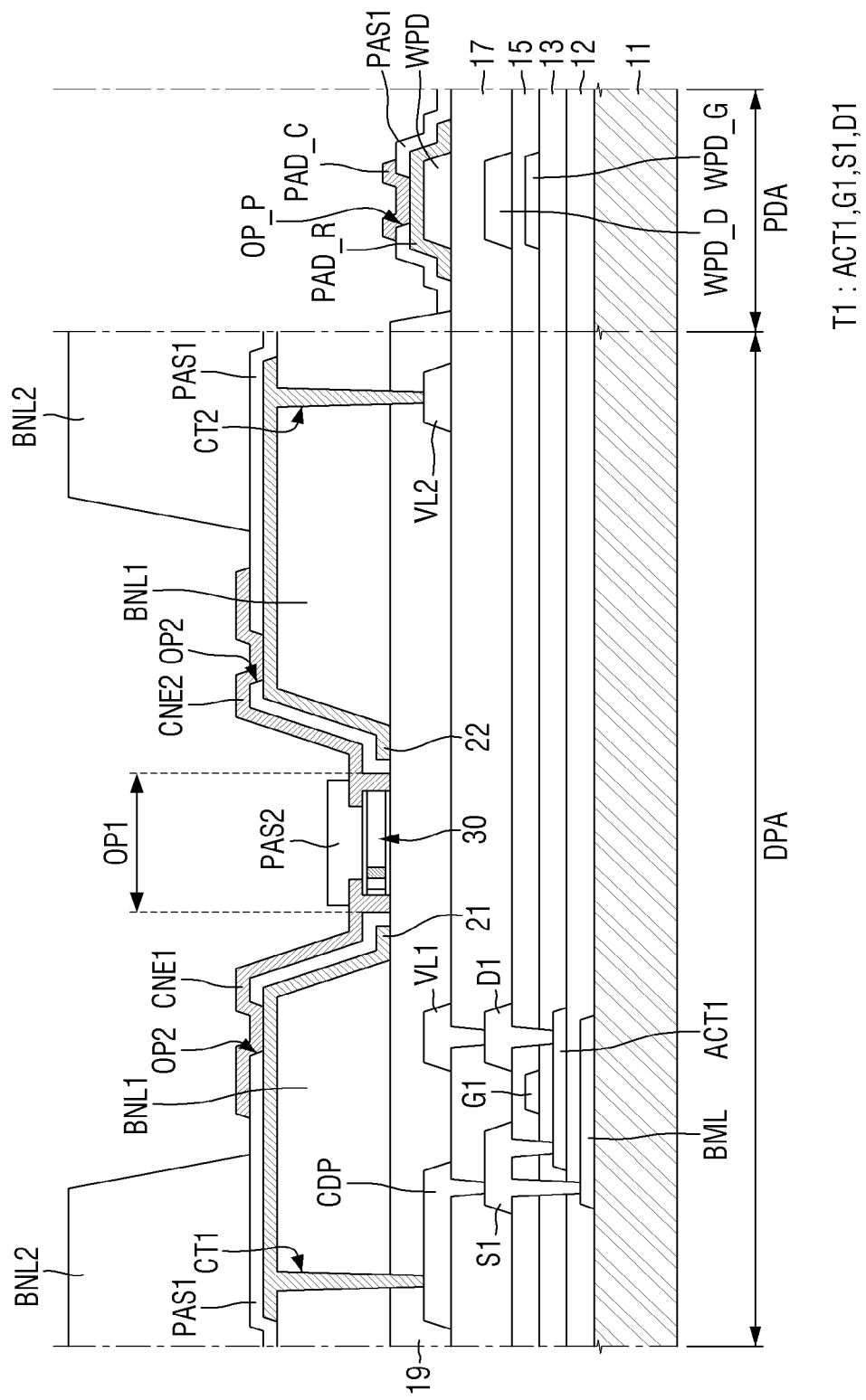

Subsequently, referring to FIG. 19, a second passivation layer PAS2 may be formed to fix the position of the light-emitting element 30. The second passivation layer PAS2 may be formed by depositing an insulating material layer entirely on the first passivation layer PAS1, and patterning it so that it covers the light-emitting element 30 and parts of the first contact electrode CNE1 and the second contact electrode CNE2. In that pad area PDA, the insulating material layer may not be deposited so that the second passivation layer PAS2 may not be formed or the material layer deposited in the pad area PDA may be completely removed.

Figure 20:
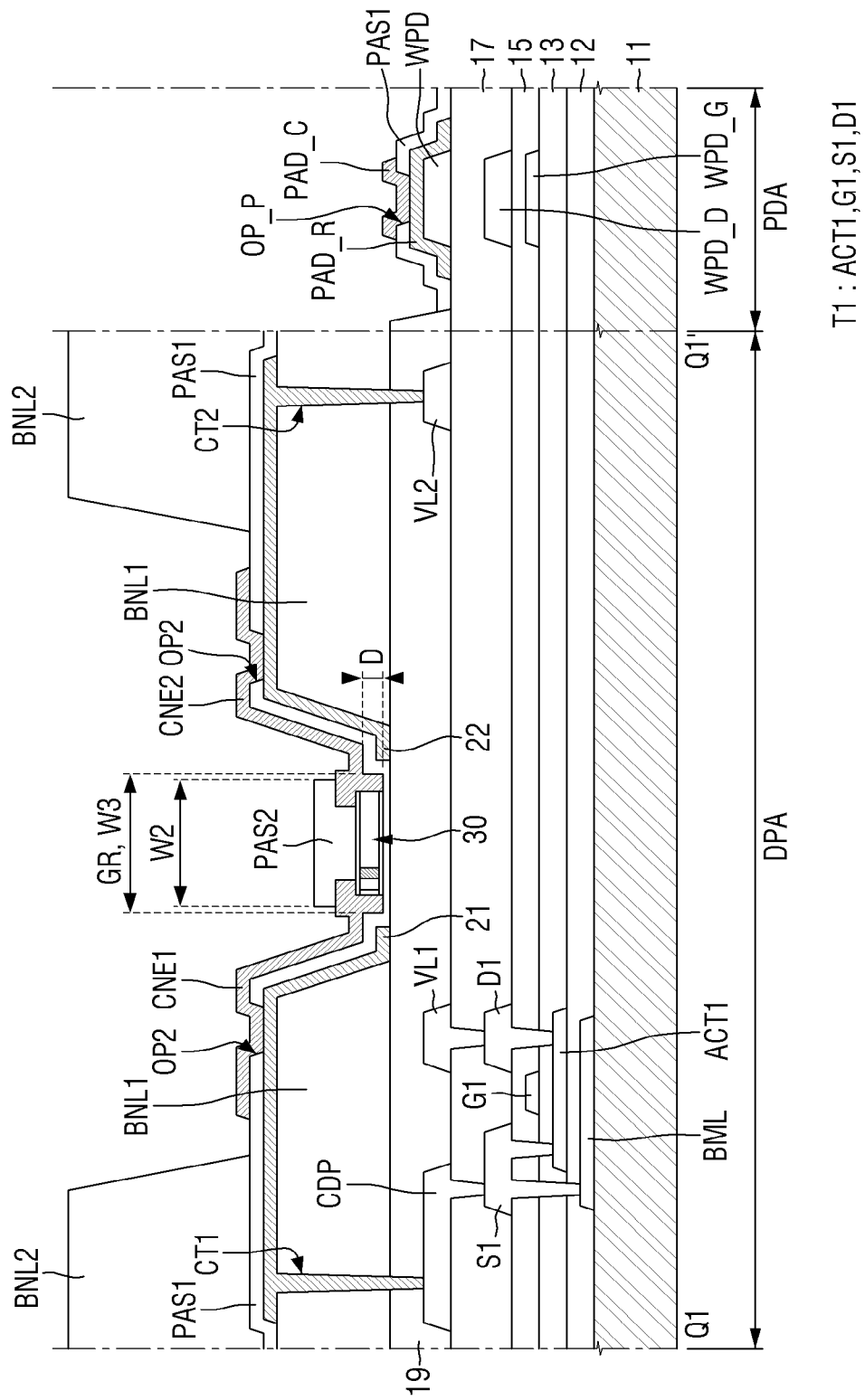
FIG. 20 is a schematic cross-sectional view showing a display device according to another embodiment of the disclosure.

FIG. 20 is a schematic cross-sectional view showing a display device according to another embodiment of the disclosure.

The embodiment of FIG. 20 may be different from the above-described embodiment of FIG. 6 in that a first passivation layer PAS1 may have a groove GR instead of the first opening OP1. In the following description, descriptions will be made focusing on differences from the above embodiments and redundant description will be omitted.

A display device 10 according to another embodiment may include a first passivation layer PAS1 disposed on the first planarization layer 19. The first passivation layer PAS1 may include a groove GR formed between the first alignment electrode 21 and the second alignment electrode 22. The groove GR may be a portion of the first passivation layer PAS1 which may be relatively thin. For example, the first passivation layer PAS1 may have a larger thickness on the first alignment electrode 21, the second alignment electrode 22 and the first banks BNL1, and may have a smaller thickness under the light-emitting element 30. The groove GR may be at least one area that overlaps the light-emitting element 30 between the first alignment electrode 21 and the second alignment electrode 22. The groove GR may also include an area between an end of the light-emitting element 30 and the first alignment electrode 21 and an area between another end of the light-emitting element 30 and the second alignment electrode 22.

The groove GR may have a depth D. The depth D of the groove GR may be about 50% or more of the thickness of the light-emitting element 30. As used herein, the thickness of the light-emitting element 30 refers to the length in the cross-section of the light-emitting element 30 parallel to the depth D direction of the groove GR. The groove GR may lead the light-emitting element 30 to be seated between the first alignment electrode 21 and the second alignment electrode 22. To this end, the groove GR may have a depth D of about 50% or more of the thickness of the light-emitting element 30 so that it can easily lead the light-emitting element 30 to be seated between the first alignment electrode 21 and the second alignment electrode 22. The groove GR may have a width W3 which may be larger than the length of the light-emitting element 30, so that the light-emitting element 30 can be easily seated.

The groove GR may not overlap the first alignment electrode 21 and the second alignment electrode 22. A sidewall of the groove GR may be spaced apart from an end of the first alignment electrode 21, and another sidewall of the groove GR may be spaced apart from an end of the second alignment electrode 22. The groove GR may be disposed and extended in the second direction DR2 in the emission area EMA, and may be disposed parallel to the first and second alignment electrodes 21 and 22.

The light-emitting element 30 may be disposed on the first passivation layer PAS1 and may be disposed in the groove GR of the first passivation layer PAS1. The light-emitting element 30 may be disposed on a same layer as the first and second alignment electrodes 21 and 22 and spaced apart from them. For example, the light-emitting element 30, the first contact electrode CNE1 and the second contact electrode CNE2 may be disposed in contact with the upper surface of the first passivation layer PAS1. The first end of the light-emitting element 30 may be spaced apart from a sidewall of the groove GR, and the second end of the light-emitting element 30 may be spaced apart from another sidewall of the groove GR.

Each of the contact electrodes CNE1 and CNE2 may electrically contact the light-emitting element 30. The first contact electrode CNE1 may fill the groove GR and may electrically contact an end of each of the light-emitting elements 30, and the second contact electrode CNE2 may fill the groove GR and may electrically contact another end of each of the light-emitting elements 30. The first contact electrode CNE1 may electrically contact an end of the light-emitting element 30 and may be disposed to extend to the upper surface of each of the light-emitting element 30. The second contact electrode CNE2 may also electrically contact the second end of each of the light-emitting elements 30 and may be disposed to extend to the upper surface of each of the light-emitting elements 30.

The second passivation layer PAS2 may be disposed on the light-emitting element 30. The second passivation layer PAS2 may be disposed to overlap the groove GR and may be extended in the first direction DR1 parallel to the first alignment electrode 21. According to an embodiment of the disclosure, the second passivation layer PAS2 may be formed in an isolated (e.g., island) pattern extended in the first direction DR1. The second passivation layer PAS2 may have a width W2 extended in the second direction DR2. The width W2 of the second passivation layer PAS2 may be smaller than the width W3 of the groove GR in the second direction DR2 and may be larger than the length of the light-emitting element 30. In another embodiment, the width W2 of the second passivation layer PAS2 may be smaller than the width W3 of the groove GR and may be smaller than the length of the light-emitting element 30. In such case, the second passivation layer PAS2 may not overlap the first contact electrode CNE1 and the second contact electrode CNE2. According to another embodiment, the second passivation layer PAS2 may be disposed entirely on the substrate 11. For example, the second passivation layer PAS2 may cover all of the second bank BNL2, the first passivation layer PAS1, the first contact electrode CNE1, the light-emitting element 30, and the second contact electrode CNE2.

The second passivation layer PAS2 can protect the light-emitting elements 30 and fix the light-emitting element 30 during the process of fabricating the display device 10. According to an embodiment of the disclosure, the second passivation layer PAS2 may cover at least an upper surface of the light-emitting element 30 exposed between the first and second contact electrodes CNE1 and CNE2, so that the light-emitting element 300 can be fixed effectively. The second passivation layer PAS2 may be extended to the upper surfaces of the first and second contact electrodes CNE1 and CNE2 to cover them, so that the first contact electrode CNE1 and the second contact electrode CNE2 can be fixed as well as the light-emitting element 30. Accordingly, an adhesive force between the light-emitting element 30 and the first contact electrode CNE1 and an adhesive force between the light-emitting element 30 and the second contact electrode CNE2 can be further increased.

In the method of fabricating a display device according to the above-described embodiment, the first opening OP1 may be formed in the first passivation layer PAS1, so that the light-emitting element 30 can be easily seated in the first opening OP1. As the second passivation layer PAS2 may be formed to cover the light-emitting element 30 and the contact electrodes CNE1 and CNE2, the light-emitting element 30 and the contact electrodes CNE1 and CNE2 can be fixed. The display device 10 can be fabricated by forming the second insulating layer PAS2, the number of masks can be reduced by omitting the process of individually patterning insulating layers or electrodes.

Hereinafter, processing steps of fabricating the display device 10 according to another embodiment will be described with reference to other drawings.

Figure 21:
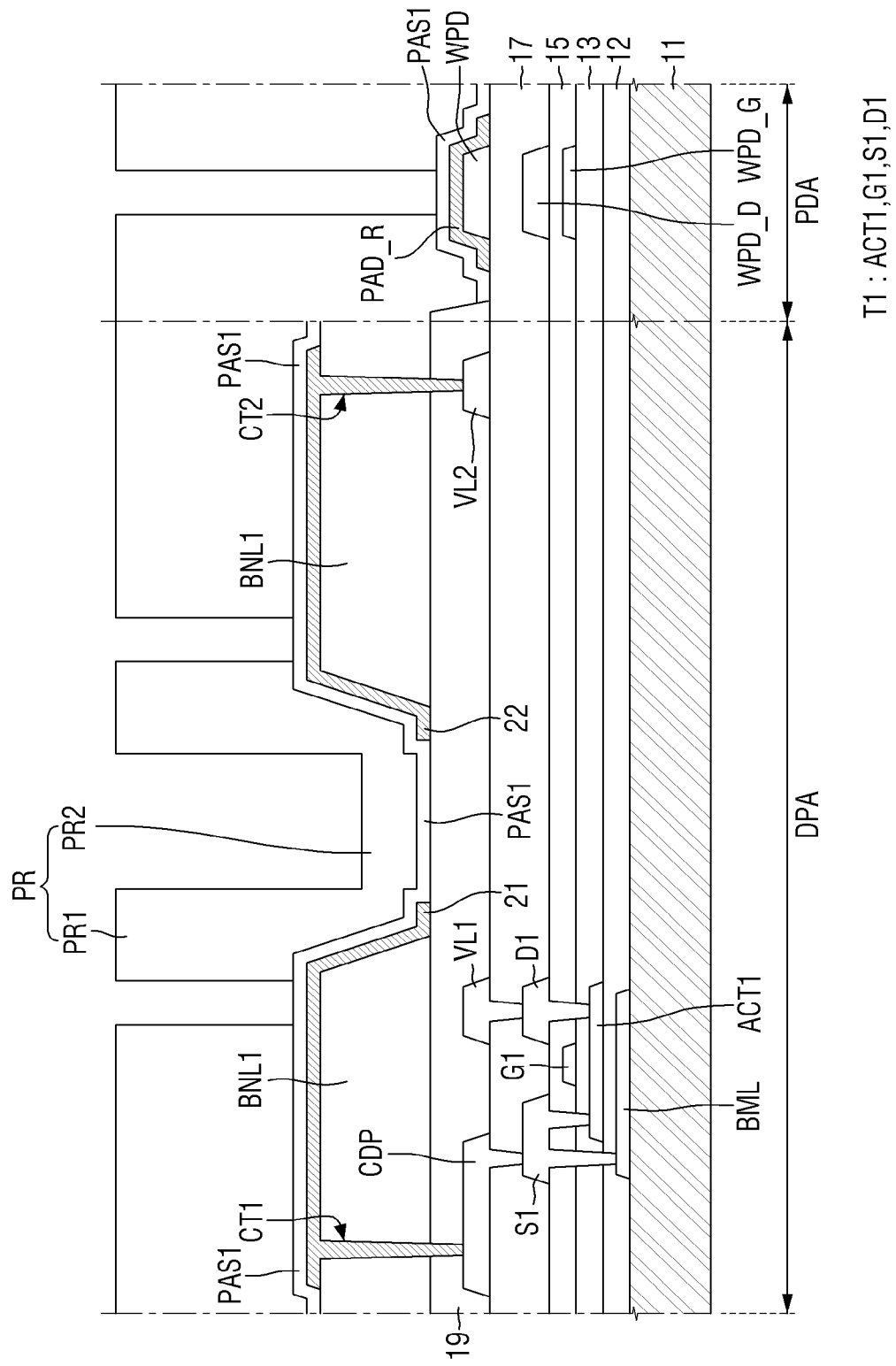
FIGS. 21 and 22 are schematic cross-sectional views showing processing steps of a method of fabricating a display device according to another embodiment of the disclosure.
Figure 22:
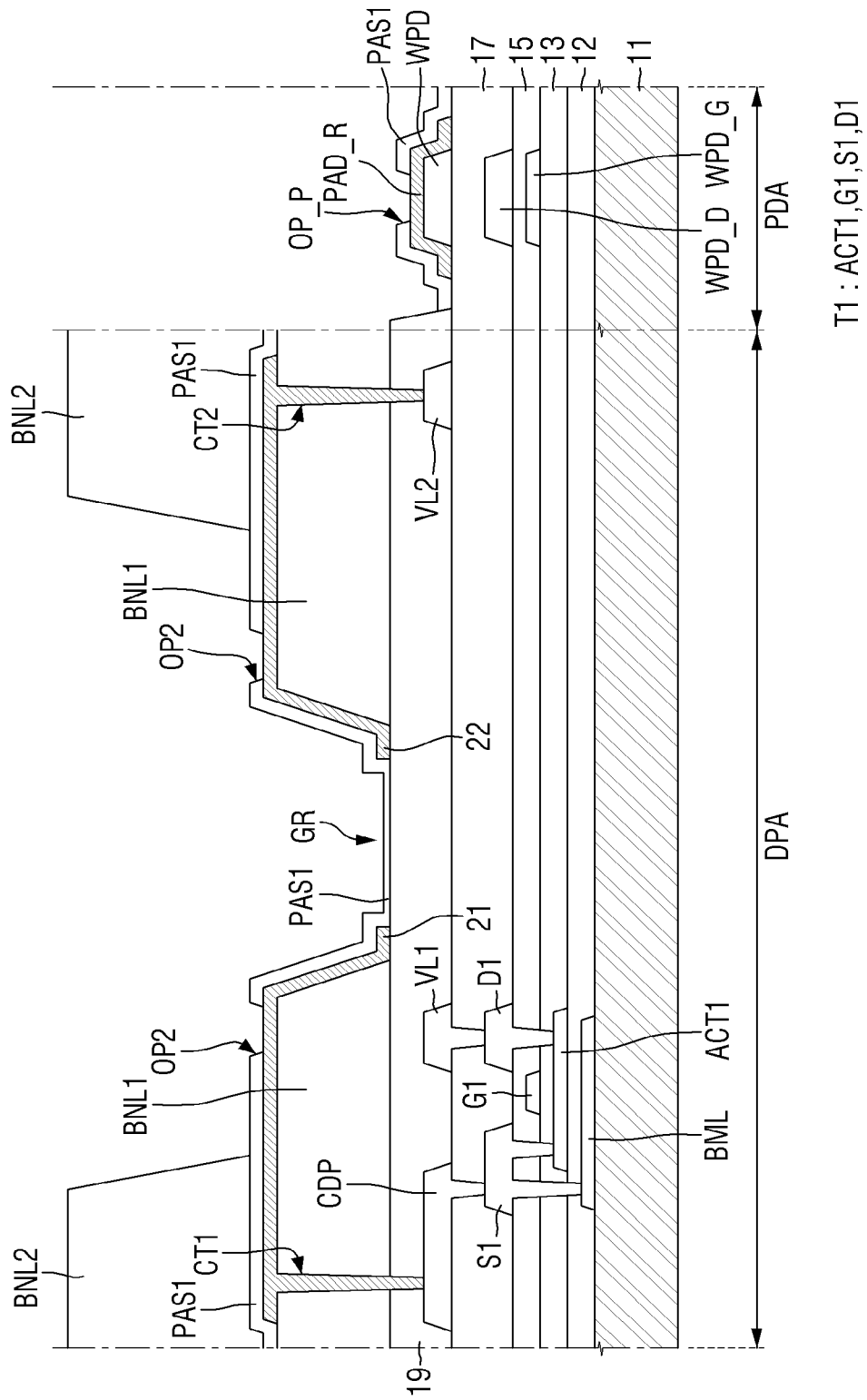

FIGS. 21 and 22 are schematic cross-sectional views showing processing steps of a method of fabricating a display device according to another embodiment of the disclosure.

The method of fabricating the display device 10 according to another embodiment disclosed in FIGS. 21 and 22 may be substantially identical to the above-described embodiment of FIGS. 10 to 19 except that a groove GR may be formed in a first passivation layer PAS1 of the first opening OP1. Therefore, redundant descriptions will be omitted.

Referring to FIG. 21, a photoresist pattern PR may be formed over a substrate 11 on which a first passivation layer PAS1 may be formed. The photoresist pattern PR may include a first photoresist pattern PR1 under which the first passivation layer PAS1 is to remain, and a second photoresist pattern PR2 under which a groove GR of the first passivation layer PAS1 having a smaller thickness is to be formed. The second photoresist pattern PR2 may be formed to be thinner than the first photoresist pattern PR1. The photoresist pattern PR may not be formed in the regions where second openings OP2 and a pad opening OP_P of the first passivation layer PAS1 are to be formed. The photoresist pattern PR may be formed using a half-tone mask or a multi-tone mask.

Subsequently, by etching the exposed first passivation layer PAS1 using the photoresist patterns PR, the second openings OP2 exposing a first alignment electrode 21 and a second alignment electrode 22, respectively, may be formed, and a pad opening OP_P exposing a pad electrode base layer PAD_R may be formed in the pad area PDA. Subsequently, the second photoresist pattern PR2 may be removed by lowering the thickness of the photoresist patterns PR to expose the first passivation layer PAS1 between the first alignment electrode 21 and the second alignment electrode 22. Subsequently, a portion of the exposed first passivation layer PAS1 may be etched to reduce the thickness of the first passivation layer PAS1 to form a groove GR. Subsequently, the remaining first photoresist pattern PR1 may be stripped and removed.

Accordingly, as shown in FIG. 22, second openings OP2 exposing the first alignment electrode 21 and the second alignment electrode 22, respectively, may be formed in the first passivation layer PAS1, and a first opening OP1 exposing the first planarization layer 19 may be formed between the first alignment electrode 21 and the second alignment electrode 22. A pad opening OP_P may be formed in the pad area PDA to expose the pad electrode base layer PAD_R.

Subsequently, a process of forming a light-emitting element 30, a first contact electrode CNE1, a second contact electrode CNE2 and a second passivation layer PAS2 may be performed in a same manner as in the example shown in FIGS. 17 to 19, thereby fabricating the display device 10.

The above-described first alignment electrode 21 and second alignment electrode 22 may not necessarily have a shape extended in one direction. In some embodiments, each of the alignment electrodes 21 and 22 of the display device 10 may have a shape which may include extended portions with different widths and extended portions in different directions.

Figure 23:
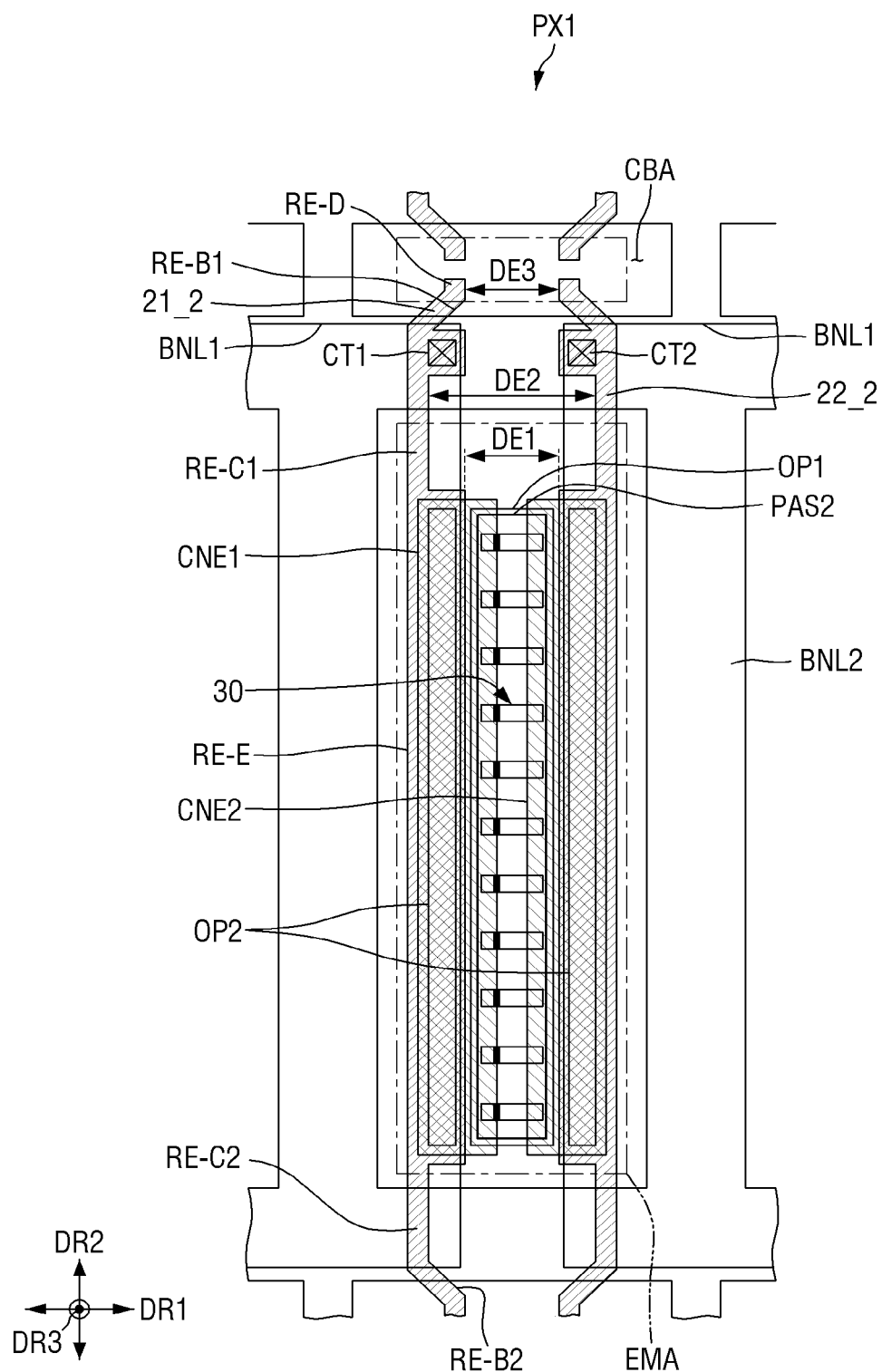
FIG. 23 is a schematic plan view showing a sub-pixel of a display device according to yet another embodiment of the disclosure.

FIG. 23 is a schematic plan view showing a sub-pixel of a display device according to yet another embodiment of the disclosure.

Referring to FIG. 23, alignment electrodes 21_2 and 22_2 of the display device 10 according to another embodiment may include an expanded portion RE-E extended in the second direction DR2 and having a larger width than other portions, bent portions RE-B1 and RE-B2 extended in a direction oblique to the first direction DR1 and the second direction DR2, and the connection portions RE-C1 and RE-C2 connecting the bent portions RE-B1 and RE-B2 with the expanded portion RE-E. The alignment electrodes 21_2 and 22_2 may have a shape generally extended in the second direction DR2, but may have a shape that has a partially larger width or may be bent in a direction oblique to the second direction DR2. The first alignment electrode 21_2 and the second alignment electrode 22_2 may be symmetrical to each other with respect to the first opening OP1 formed therebetween. Hereinafter, the shape of a first alignment electrode 21_2 may be described mainly.

The first alignment electrode 21_2 may include the expanded portion RE-E having a larger width than other portions. The expanded portion RE-E may be disposed on the first bank BNL1 in the emission area EMA of the sub-pixel PXn and may be extended in the second direction DR2. The first opening OP1 may be formed between the extended portions RE-E of the first alignment electrode 21_2 and the second alignment electrode 22_2, and the light-emitting elements 30 may be disposed thereon.

The connection portions RE-C1 and RE-C2 may be connected to both sides of each of the expanded portions RE-E in the second direction DR2, respectively. The first connection portion RE-C1 may be disposed on a side of the expanded portion RE-E in the second direction DR2, while the second connection portion RE-C2 may be disposed on another side. The connection portions RE-C1 and RE-C2 may be connected to the expanded portion RE-E and may be disposed across the emission area EMA of each sub-pixel PXn and the second bank BNL2.

The widths of the first connection portion RE-C1 and the second connection portion RE-C2 may be smaller than the width of the expanded portion RE-E. A side of each of the connection portions RE-C1 and RE-C2 extended in the second direction DR2 may be connected to and in line with a side of the expanded portion RE-E extended in the second direction DR2. For example, the outer one of both sides of the expanded portion RE-E and the connection portions RE-C1 and RE-C2 with respect to the center of the emission area EMA may be extended and connected to one another. Accordingly, the distance DE1 between the expanded portions RE-E of the first alignment electrode 21_2 and the second alignment electrode 22_2 may be smaller than the distance DE2 between the connection portions RE-C1 and RE-C2.

The bent portions RE-B1 and RE-B2 may be connected to the connection portions RE-C1 and RE-C2, respectively. The bent portions RE-B1 and RE-B2 may include the first bent portion RE-B1 connected to the first connection portion RE-C1 and disposed across the second bank BNL2 and the cut area CBA, and the second bent portion RE-B2 connected to the second connection portion RE-C2 and disposed across the second bank BNL2 and the cut area CBA of another sub-pixel PXn. The bent portions RE-B1 and RE-B2 may be connected to the connection portions RE-C1 and RE-C2 and may be bent toward a direction oblique to the second direction DR2, e.g., the center of the sub-pixel PXn. Accordingly, the shortest distance DE3 between the bent portions RE-B1 and RE-B2 of the first alignment electrode 21_2 and the second alignment electrode 22_2 may be smaller than the distance DE2 between the connection portions RE-C1 and RE-C2. However, the shortest distance DE3 between the bent portions RE-B1 and RE-B2 may be larger than the distance DE1 between the expanded portions RE-E.

A contact portion RE-P having a relatively large width may be formed at a position where the first connection portion RE-C1 and the first bent portion RE-B1 may be connected. The contact portion RE-P may overlap the second bank BNL2 to form a first contact hole CT1 and a second contact hole CT2 of the first alignment electrode 21_2 and the second alignment electrode 22_2.

At an end of the first bent portion RE-B1, a fragment portion RE-D may be formed which may be the remaining portion of each of the first alignment electrode 21_2 and the second alignment electrode 22-2 in the cut area CBA after they have been cut. The fragment portion RE-D may be the remaining portion of each of the first alignment electrodes 21_2 and 22_2 of the sub-pixels PXn adjacent to one another in the second direction DR2 after they have been disconnected.

The embodiment of FIG. 23 may be different from the embodiment of FIG. 5 in that the first alignment electrode 21_2 and the second alignment electrode 22_2 may include r extended portions RE-E, the connection portions RE-C1 and RE-C2 and the bent portions RE-B1 and RE-B2, which may be symmetrically arranged with respect to the center of the sub-pixel PXn. It is, however, to be understood that the disclosure is not limited thereto. In some implementations, the first alignment electrode 21_2 and the second alignment electrode 22_2 may have different shapes.

Figure 24:
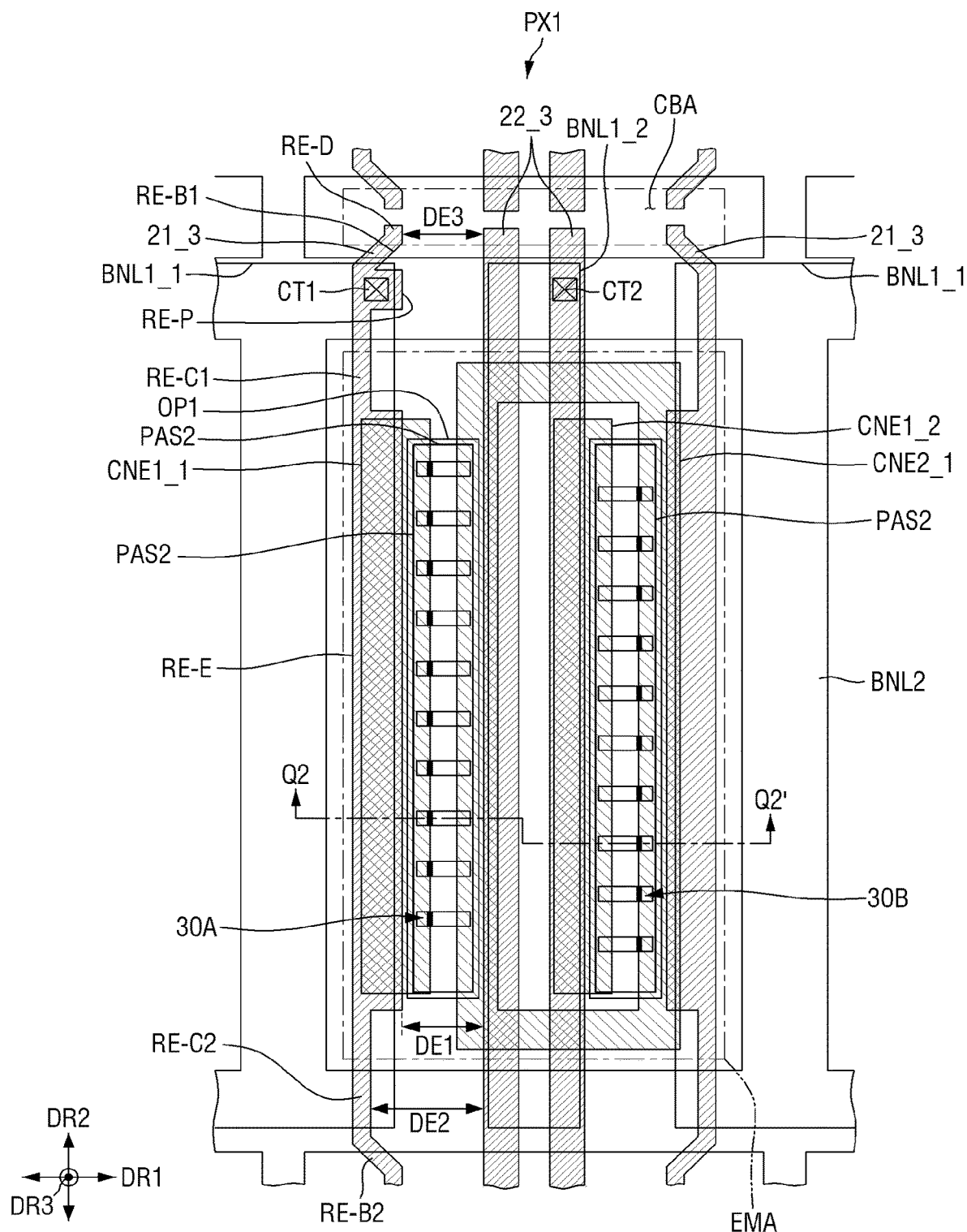
FIG. 24 is a schematic plan view showing a sub-pixel of a display device according to yet another embodiment of the disclosure.
Figure 25:
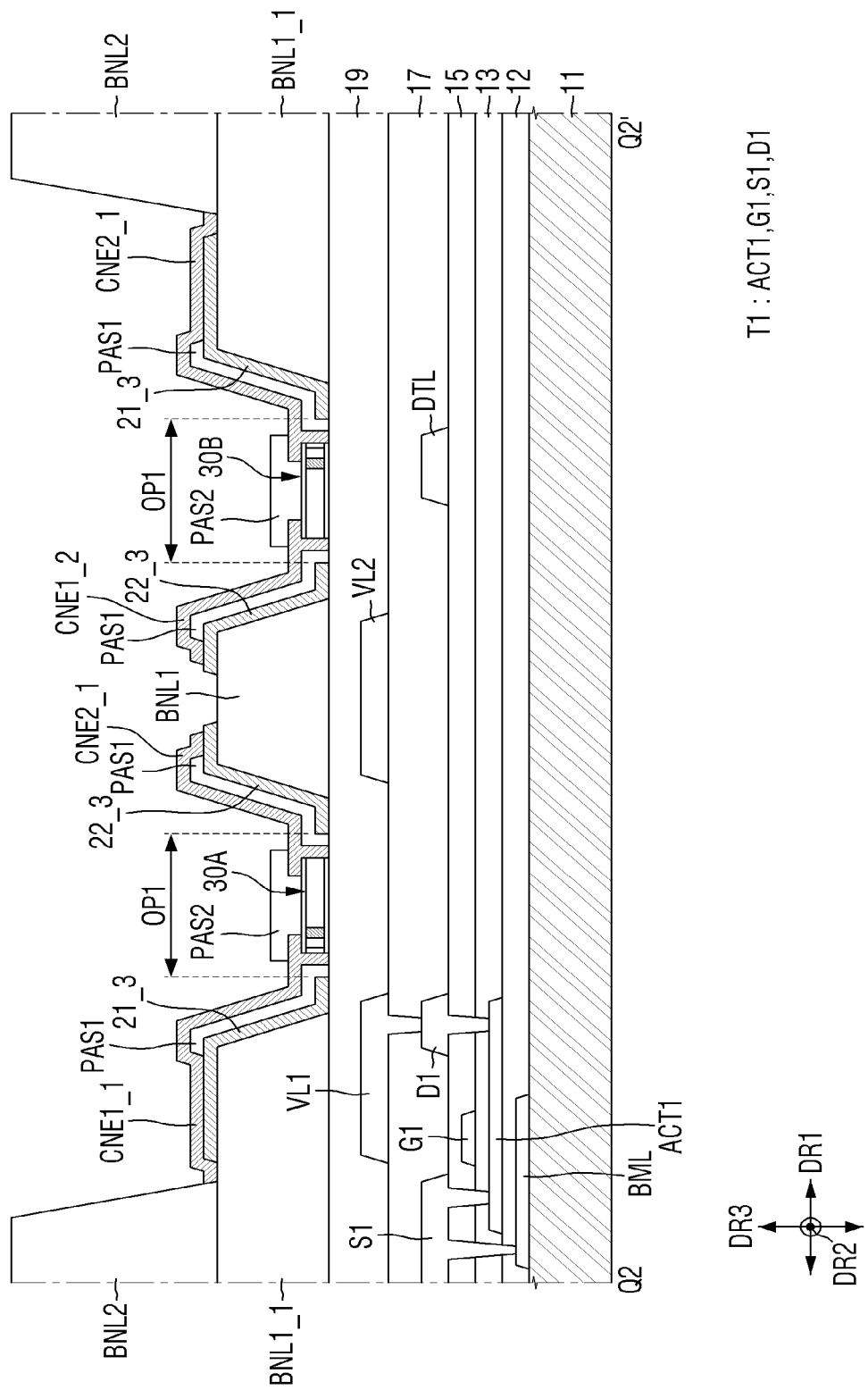
FIG. 25 is a schematic cross-sectional view taken along line Q2-Q2' of FIG. 24.

FIG. 24 is a schematic plan view showing a sub-pixel of a display device according to yet another embodiment of the disclosure. FIG. 25 is a schematic cross-sectional view taken along line Q2-Q2' of FIG. 24.

Referring to FIGS. 24 and 25, the display device 10 may include first alignment electrodes 21_3 and second alignment electrodes 22_3 in each of the sub-pixels PXn. The first alignment electrodes 21_3 may have a same shape as in the embodiment of FIG. 23, and the first alignment electrodes 21_3, e.g., two first alignment electrodes 21_3 may be disposed symmetrically with respect to the center of the sub-pixel PXn. The second alignment electrodes 22_3 may have a same shape as in the embodiment of FIG. 5, and two second alignment electrodes 22_3 may be disposed between the first alignment electrodes 21_3, for example. The distance between the first alignment electrodes 21_3 and the second alignment electrodes 22_3 may vary depending on the portion of the first alignment electrodes 21_3. For example, the distance DE1 between the expanded portion RE-E and the second alignment electrode 22_3 may be smaller than the distances between the connection portions RE-C1 and RE-C2 and the second alignment electrode 22_3 and between the bent portions RE-B1 and RE-B2 and the second alignment electrode 22_3. The distance DE2 between the connection portions RE-C1 and RE-C2 and the second alignment electrode 22_3 may be larger than the distance DE3 between the bent portions RE-B1 and RE-B2 and the second alignment electrode 22_3. It is, however, to be understood that the disclosure is not limited thereto. The shape of each of the alignment electrodes 21_3 and 22_3 may be identical to that described above with reference to FIGS. 5 and 23; and, therefore, redundant descriptions will be omitted.

The arrangements and shapes of the first banks BNL1 (BNL1_1 and BNL1_2) and the contact electrodes CNE1_1, CNE1_2, and CNE2_1 disposed in each sub-pixel PXn may be changed depending on the arrangement of the first alignment electrodes 21_3 and the second alignment electrodes 22_3.

The first opening OP1 may be formed between the expanded portion RE-E of the first alignment electrode 21_3 and the second alignment electrode 22_3, and both sides thereof may be spaced apart from them. A first end of the light-emitting element 30 may face an end of the expanded portion RE-E of the first alignment electrode 21_3 while a second end thereof may face an end of the second alignment electrode 22_3.

The first bank BNL1 may include a first sub-bank BNL1_1 and a second sub-bank BNL1_2 having different widths. The first sub-bank BNL1_1 and the second sub-bank BNL1_2 may be extended in the second direction DR2 and may have different widths measured in the first direction DR1. As the first sub-bank BNL1_1 has a larger width than the second sub-bank BNL1_2, it may be disposed across the boundary of the adjacent sub-pixel PXn in the first direction DR1. For example, the first sub-bank BNL1_1 may be disposed at the boundary between the emission areas EMA, including the emission areas EMA of the sub-pixels PXn. Accordingly, a portion of the portions of the second bank BNL2 extended in the second direction DR2 may be disposed on the first sub-bank BNL1_1. Two first sub-banks BNL1_1 may be partially disposed in one sub-pixel PXn. A second sub-bank BNL1_2 may be disposed between the first sub-banks BNL1_1.

The second sub-bank BNL1_2 may be extended in the second direction DR2 from the center of the emission area EMA of the sub-pixel PXn. The second sub-bank BNL1_2 may have a width smaller than that of the first sub-bank BNL1_1 and may be spaced apart therebetween.

The expanded portions RE-E of the first alignment electrode 21_3 and the second bank BNL2 may be disposed on the first sub-banks BNL1_1. The expanded portions RE-E of the first alignment electrode 21_3 of the sub-pixels PXn adjacent in the first direction DR1 may be disposed on the first sub-bank BNL1_1. That is to say, the expanded portions RE-E of the two first alignment electrodes 21_3 may be disposed on a first sub-bank BNL1_1. Two second alignment electrodes 22_3 may be disposed on the second sub-bank BNL1_2. The second alignment electrodes 22_3 may be disposed on both sides of the second sub-bank BNL1_2 in the second direction DR2 and may be spaced apart from each other on the second sub-bank BNL1_2.

One of the first alignment electrodes 21_3 may include a contact portion RE-P to form a first contact hole CT1, while another one of the first alignment electrode 21_3 may not have a contact portion RE-P. Similarly, one of the second alignment electrodes 22_3 may include a contact portion RE-P to form a second contact hole CT2, and another of the second alignment electrodes 22_3 may not have a contact portion RE-P. The alignment electrodes 21_3 and 22_3 connected to the first transistor T1 or the second voltage line VL2 through the contact holes CT1 and CT2 may receive electrical signals, and another of the alignment electrodes 21_3 and 22_3 may receive electrical signals through contact electrodes CNE1_1, CNE1_2 and CNE2_1 to be described later.

The light-emitting elements 30 may be disposed in the first opening OP1. An end of each of the light-emitting elements 30 may face and be spaced apart from an end of the first alignment electrode 21_3, and a first passivation layer PAS1 may be disposed therebetween. Another end of each of the light-emitting elements 30 may face and be spaced apart from an end of the second alignment electrode 22_3, and the first passivation layer PAS1 may be disposed therebetween. Accordingly, the first ends of the first light-emitting elements 30A between the alignment electrodes 21_3 and 22_3 disposed on the left side of the center of the sub-pixel PXn and the first ends of the second light-emitting elements 30B between the alignment electrodes 21_3 and 22_3 disposed on the right side of the center of the sub-pixel PXn may face opposite directions.

As the display device 10 may include a larger number of alignment electrodes 21_3 and 22_3, it may include a larger number of contact electrodes CNE1_1, CNE1_2, and CNE2_1.

In an embodiment, the contact electrodes CNE1_1, CNE1_2 and CNE2_1 may include a first contact electrode CNE1_1 disposed on one of the first alignment electrodes 21_3, a second contact electrode CNE1_2 disposed on one of the second alignment electrodes 22_3, and a third contact electrode CNE2_1 disposed on another one of the first alignment electrode 21_3 and the second alignment electrode 22_3 and surrounding the second contact electrode CNE1_2.

The first contact electrode CNE1_1 may be disposed on one of the first alignment electrodes 21_3. For example, the first contact electrode CNE1_1 may be disposed on the expanded portion RE-E of the first alignment electrode 21_3 on which the first ends of the first light-emitting elements 30A may be disposed. The first contact electrode CNE1_1 may electrically contact the expanded portion RE-E of the first alignment electrode 21_3 and may electrically contact the first ends of the first light-emitting elements 30A. The second contact electrode CNE1_2 may be disposed on one of the second alignment electrodes 22_3. For example, the second contact electrode CNE1_2 may be disposed on the second alignment electrode 22_3 on which the second ends of the second light-emitting elements 30B may be disposed. The second contact electrode CNE1_2 may electrically contact the second alignment electrode 22_3 and may electrically contact the second ends of the second light-emitting elements 30B. The first contact electrode CNE1_1 and the second contact electrode CNE1_2 may electrically contact the alignment electrodes electrode 21_3 and 22_3 in which the first contact hole CT1 and the second contact hole CT2 may be formed, respectively. The first contact electrode CNE1_1 may electrically contact the first alignment electrode CNE1_1 electrically connected to the first transistor T1 through the first contact hole CT1, and the second contact electrode CNE1_2 may electrically contact the second electrode 22_3 electrically connected to the second voltage line VL2 through the second contact hole CT2. The first contact electrode CNE1_1 and the second contact electrode CNE1_2 may transmit electric signals applied from the first transistor T1 or the second voltage line VL2 to the light-emitting elements 30. The first contact electrode CNE1_1 and the second contact electrode CNE1_2 may be substantially identical to those described above.

The alignment electrodes 21_3 and 22_3 in which the contact holes CT1 and CT2 may not be formed may be further disposed in each sub-pixel PXn. These may be substantially floating, i.e., no electric signal may be directly applied thereto from the first transistor T1 or the second voltage line VL2. However, the third contact electrode CNE2_1 may be disposed on the alignment electrodes 21_3 and 22_3 on which the contact holes CT1 and CT2 may not be formed, and the electric signal transmitted to the light-emitting elements 30 may flow through the third contact electrode CNE2_1.

The third contact electrode CNE2_1 may be disposed on the first alignment electrode 21_3 and the second alignment electrode 22_3 where the contact holes CT1 and CT2 may not be formed, and may be disposed to surround the second contact electrode CNE1_2. The third contact electrode CNE2_1 may surround the second contact electrode CNE1_2, including portions extended in the second direction DR2 and portions extended in the first direction DR1 to connect them. The portions of the third contact electrode CNE2_1 extended in the second direction DR2 may be disposed on the first alignment electrode 21_3 and the second alignment electrode 22_3 where the contact holes CT1 and CT2 may not be formed, respectively, and may be in contact with the light-emitting elements 30. For example, a portion of the third contact electrode CNE2_1 disposed on the second alignment electrode 22_3 may electrically contact the second ends of the first light-emitting elements 30A, and a portion of the third contact electrode CNE2_1 disposed on the first alignment electrode 21_3 may electrically contact first ends of the second light-emitting element 30B. The portion of the third contact electrode CNE2_1 extended in the first direction DR1 may overlap the second alignment electrode 22_3 where the second contact hole CT2 may be formed, but there may be another insulating layer (not shown) therebetween so that they may not be directly connected to each other.

An electric signal transmitted from the first contact electrode CNE1_1 to the first ends of the first light-emitting element 30A may be transmitted to the third contact electrode CNE2_1 in electrical contact with the second ends of the first light-emitting element 30A. The third contact electrode CNE2_1 may transmit the electric signal to the first ends of the second light emitting element 30B, which may be transmitted to the second alignment electrode 22_3 through the second contact electrode CNE1_2. Accordingly, the electric signal for emission of the light-emitting elements 30 may be transmitted only to one first alignment electrode 21_3 and one second alignment electrode 22_3, and the first light-emitting elements 30A and the second light-emitting elements 30B may be connected in series through the third contact electrode CNE2_1.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a planarization layer disposed on a substrate;
   a first alignment electrode and a second alignment electrode that extend in a first direction and are spaced apart from each other on the planarization layer;
   a first insulating layer disposed on the first alignment electrode and the second alignment electrode, the first insulating layer comprising a first opening exposing- over the planarization layer between the first alignment electrode and the second alignment electrode;
   a light-emitting element disposed on the planarization layer overlapping the first opening;
   a first contact electrode and a second contact electrode disposed on the first insulating layer, the first contact electrode electrically contacting a first end of the light-emitting element and the second contact electrode electrically contacting a second end of the light-emitting element; and
   a second insulating layer disposed on the light-emitting element, wherein
   the first contact electrode, the second contact electrode, and the light-emitting element contact the planarization layer.

2. The display device of claim 1, wherein the first alignment electrode, the second alignment electrode and the light-emitting element are disposed on planarization layer and spaced apart from each other, and contact the planarization layer.

3. The display device of claim 2, wherein
   an end of the first alignment electrode faces the first end of the light-emitting element, and
   an end of the second alignment electrode faces the second end of the light-emitting element.

4. The display device of claim 2, wherein
   the first contact electrode is disposed between an end of the first alignment electrode and the first end of the light-emitting element, and
   the second contact electrode is disposed between an end of the second alignment electrode and the second end of the light-emitting element.

5. The display device of claim 2, wherein
   the first insulating layer comprises second openings exposing the first alignment electrode and the second alignment electrode,
   the first contact electrode electrically contacts the first alignment electrode through one of the second openings, and
   the second contact electrode electrically contacts the second alignment electrode through another one of the second openings.

6. The display device of claim 5, wherein the first opening and the second openings extend parallel to the first alignment electrode.

7. The display device of claim 6, wherein the second insulating layer overlaps the first opening and extends parallel to the first alignment electrode.

8. The display device of claim 7, wherein the second insulating layer does not overlap the first alignment electrode and the second alignment electrode, and has an isolated pattern.

9. The display device of claim 8, wherein a width of the second insulating layer is smaller than a width of the first opening and larger than a length of the light-emitting element in a second direction perpendicular to the first direction.

10. The display device of claim 1, wherein the second insulating layer overlaps all of the first contact electrode, the second contact electrode, and the light-emitting element.

11. The display device of claim 1, wherein the second insulating layer overlaps the light-emitting element and does not overlap the first contact electrode and the second contact electrode.

* * * * *